(12) United States Patent
Yamakita et al.

(10) Patent No.: US 9,246,012 B2
(45) Date of Patent: Jan. 26, 2016

(54) DISPLAY UNIT AND ELECTRONIC APPARATUS

(71) Applicant: Sony Corporation, Tokyo (JP)

(72) Inventors: Shigehiro Yamakita, Kanagawa (JP); Eri Matsuo, Kanagawa (JP); Hiroshi Nishikawa, Kanagawa (JP); Kimihiro Shinya, Kanagawa (JP); Tomoatsu Kinoshita, Tokyo (JP); Masanori Nishiyama, Kanagawa (JP); Kenichi Izumi, Kanagawa (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/454,365

(22) Filed: Aug. 7, 2014

(65) Prior Publication Data

US 2015/0048361 A1 Feb. 19, 2015

(30) Foreign Application Priority Data

Aug. 15, 2013 (JP) ................................. 2013-168929

(51) Int. Cl.
| | | |
|---|---|---|
| *H01L 29/10* | (2006.01) | |
| *H01L 29/12* | (2006.01) | |
| *H01L 29/04* | (2006.01) | |
| *H01L 29/786* | (2006.01) | |
| *H01L 27/32* | (2006.01) | |
| *H01L 27/12* | (2006.01) | |
| H01L 51/52 | (2006.01) | |

(52) U.S. Cl.
CPC ........ *H01L 29/7869* (2013.01); *H01L 27/1225* (2013.01); *H01L 27/3244* (2013.01); *H01L 29/78606* (2013.01); H01L 51/5259 (2013.01)

(58) Field of Classification Search
CPC ..................... H01L 29/74869; H01L 27/3244; H01L 29/78693; H01L 27/3248
USPC ................ 257/43, 52, 60, E21.411, E21.461, 257/E21.476
See application file for complete search history.

(56) References Cited

U.S. PATENT DOCUMENTS

| | | | | |
|---|---|---|---|---|
| 4,110,425 | A * | 8/1978 | Buhl et al. ................. | 423/658.2 |
| 7,176,041 | B2 * | 2/2007 | Lee et al. ........................... | 438/8 |
| 2006/0054022 | A1 * | 3/2006 | Hosoe et al. ..................... | 96/108 |
| 2008/0171890 | A1 * | 7/2008 | Kim et al. ....................... | 556/146 |
| 2011/0180308 | A1 * | 7/2011 | Nakamura et al. ............ | 174/255 |
| 2014/0183528 | A1 * | 7/2014 | Endo ................... | H01L 27/1255 257/43 |
| 2015/0021631 | A1 * | 1/2015 | Huh .................... | H01L 27/1218 257/88 |

FOREIGN PATENT DOCUMENTS

| | | | |
|---|---|---|---|
| JP | 61253832 | A * | 11/1986 |
| JP | 2007-123861 | A | 5/2007 |
| JP | 2008-141119 | A | 6/2008 |
| JP | 2012/216739 | A | 11/2012 |
| JP | 2012-216792 | A | 11/2012 |
| JP | 2012-216794 | A | 11/2012 |
| JP | 2012-216795 | A | 11/2012 |

* cited by examiner

*Primary Examiner* — Mohsen Ahmadi
(74) *Attorney, Agent, or Firm* — Wolf, Greenfield & Sacks, P.C.

(57) ABSTRACT

A display unit includes: an oxide semiconductor layer configured to form a channel; a first layer having electrical insulation or electrical conductivity; and a second layer including a hydrogen absorbent and disposed between the oxide semiconductor layer and the first layer.

19 Claims, 18 Drawing Sheets

DISPLAY UNIT AND ELECTRONIC APPARATUS

CROSS REFERENCE TO RELATED APPLICATIONS

This application claims the benefit of Japanese Priority Patent Application JP 2013-168929 filed Aug. 15, 2013, the entire contents which are incorporated herein by reference.

BACKGROUND

The present disclosure relates to a display unit and an electronic apparatus that include a thin film transistor (TFT) using an oxide semiconductor as a channel.

Recently, organic electroluminescence (EL) display units using an organic EL device have been attracting attention as alternative display units to liquid crystal display units. The organic EL display units are self-luminous type display units, and have a characteristic of low power consumption. Moreover, the organic EL display units have advantages of a wide viewing angle, excellent contrast, and fast response speed; therefore, the organic EL display units have been attracting attention as next-generation flat display units. In particular, development of active matrix (AM) organic EL display units in which a TFT is provided to each pixel to control light emission and a light emission level has been advanced.

Most of TFTs used in the above-described display units often use amorphous silicon, polycrystalline silicon, and the like as a channel (a semiconductor layer); however, recently, a technique to apply a TFT using an oxide semiconductor to an electronic device or an optical device has been attracting attention. For example, in a semiconductor unit in Japanese Unexamined Patent Application Publication No. 2007-123861, a TFT using an oxide semiconductor such as zinc oxide or an In—Ga—Zn—O-based oxide as a switching device of each pixel is disclosed.

The TFT including a semiconductor layer formed of the oxide semiconductor is susceptible to hydrogen. More specifically, a threshold voltage is shifted toward a negative direction to cause deterioration in characteristics of the TFT, because hydrogen serves as a donor to release electrons as carriers, thereby forming a channel in the semiconductor layer without applying a voltage to a gate electrode. For example, Japanese Unexamined Patent Application Publication No. 2008-141119 indicates that, when hydrogen is added to an oxide semiconductor film, electrical conductivity is increased by about 4 to 5 digits. Moreover, it is described that hydrogen is diffused into the oxide semiconductor film from an insulating film in contact with the oxide semiconductor film. Thus, the oxide semiconductor is extremely sensitive to hydrogen, and even a small amount of hydrogen included in the TFT may affect the characteristics of the TFT.

On the other hand, for example, in semiconductor units in Japanese Unexamined Patent Application Publication Nos. 2012-216792, 2012-216793, 2012-216794, and 2012-216795, a laminate film formed by laminating a hydrogen permeable film and a hydrogen capture film in order from an oxide semiconductor film is formed as a gate insulating film below the oxide semiconductor film. In the semiconductor units, hydrogen released from the oxide semiconductor film during heat treatment is captured by the hydrogen capture film, and a concentration of hydrogen in proximity to an interface of the oxide semiconductor film is reduced to secure the characteristics of the TFT.

SUMMARY

However, in the laminate film of the hydrogen permeable film and the hydrogen capture film described in Japanese Unexamined Patent Application Publication Nos. 2012-216792, 2012-216793, 2012-216794, and 2012-216795 is configured to reduce the concentration of hydrogen in the oxide semiconductor film in a process of manufacturing the TFT. Therefore, even though initial characteristics of the TFT is stable, the laminate film is not allowed to sufficiently capture hydrogen gradually released from a film (for example, a protective film) including hydrogen formed in the semiconductor unit or hydrogen entering from outside of the semiconductor unit, thereby reducing deterioration in the characteristics of the TFT caused by change with time or environmental change.

It is desirable to provide a display unit and an electronic apparatus that have high resistance to hydrogen and improved reliability.

According to an embodiment of the present disclosure, there is provided a display unit including: an oxide semiconductor layer configured to form a channel; a first layer having electrical insulation or electrical conductivity; and a second layer including a hydrogen absorbent and disposed between the oxide semiconductor layer and the first layer.

According to an embodiment of the present disclosure, there is provided an electronic apparatus provided with a display unit, the display unit including: an oxide semiconductor layer configured to form a channel; a first layer having electrical insulation or electrical conductivity; and a second layer including a hydrogen absorbent and disposed between the oxide semiconductor layer and the first layer.

In the display unit and the electronic apparatus according to the embodiments of the present disclosure, the second layer including the hydrogen absorbent is disposed between the oxide semiconductor layer forming the channel and the first layer having electrical insulation or electrical conductivity. Therefore, the oxide semiconductor layer is less likely to be exposed to hydrogen released from inside or hydrogen entering from outside.

In the display unit and the electronic apparatus according to the embodiments of the present disclosure, the second layer including the hydrogen absorbent is disposed between the oxide semiconductor layer and the first layer having electrical insulation or electrical conductivity. Therefore, hydrogen included in the display unit or outside air is absorbed by the second layer, and deterioration in characteristics caused by exposure of the oxide semiconductor layer to hydrogen is reduced. In other words, a display unit having high resistance to hydrogen and improved reliability and an electronic apparatus including the display unit are allowed to be provided.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the technology, and are incorporated in and constitute a part of this specification. The drawings illustrate embodiments and, together with the specification, serve to explain the principles of the technology.

FIG. 16A is a perspective view illustrating an appearance viewed from a front side of Application Example 1 of the display units using a pixel according to the above-described embodiments and the like.

FIG. 16B is a perspective view illustrating an appearance viewed from a back side of Application Example 1 of the display units using the pixel according to the above-described embodiments and the like.

DETAILED DESCRIPTION

Some embodiments of the present disclosure will be described in detail below referring to the accompanying drawings. It is to be noted that description will be given in the following order.

1. Configuration of Hydrogen Absorption Layer
2. First Embodiment (Top emission display unit; Example in which a wiring layer serves as a hydrogen absorption layer)
 2-1. Basic Configuration
 2-2. Manufacturing Method
 2-3. Entire Configuration of Display Unit
3. Modification Example 1 (Example in which a hydrogen absorption layer is formed on a surface of a wiring layer)
4. Second Embodiment (Example in which an insulating layer serves as a hydrogen absorption layer)
5. Third Embodiment (Example in which a hydrogen absorption layer is additionally formed)
6. Fourth Embodiment (Example in which a flexible substrate is used)
7. Modification Example 2 (Example of bottom emission display unit)
8. Modification Example 3 (Example of top gate TFT)
9. Application Examples

1. CONFIGURATION OF HYDROGEN ABSORPTION LAYER

Figure 1:
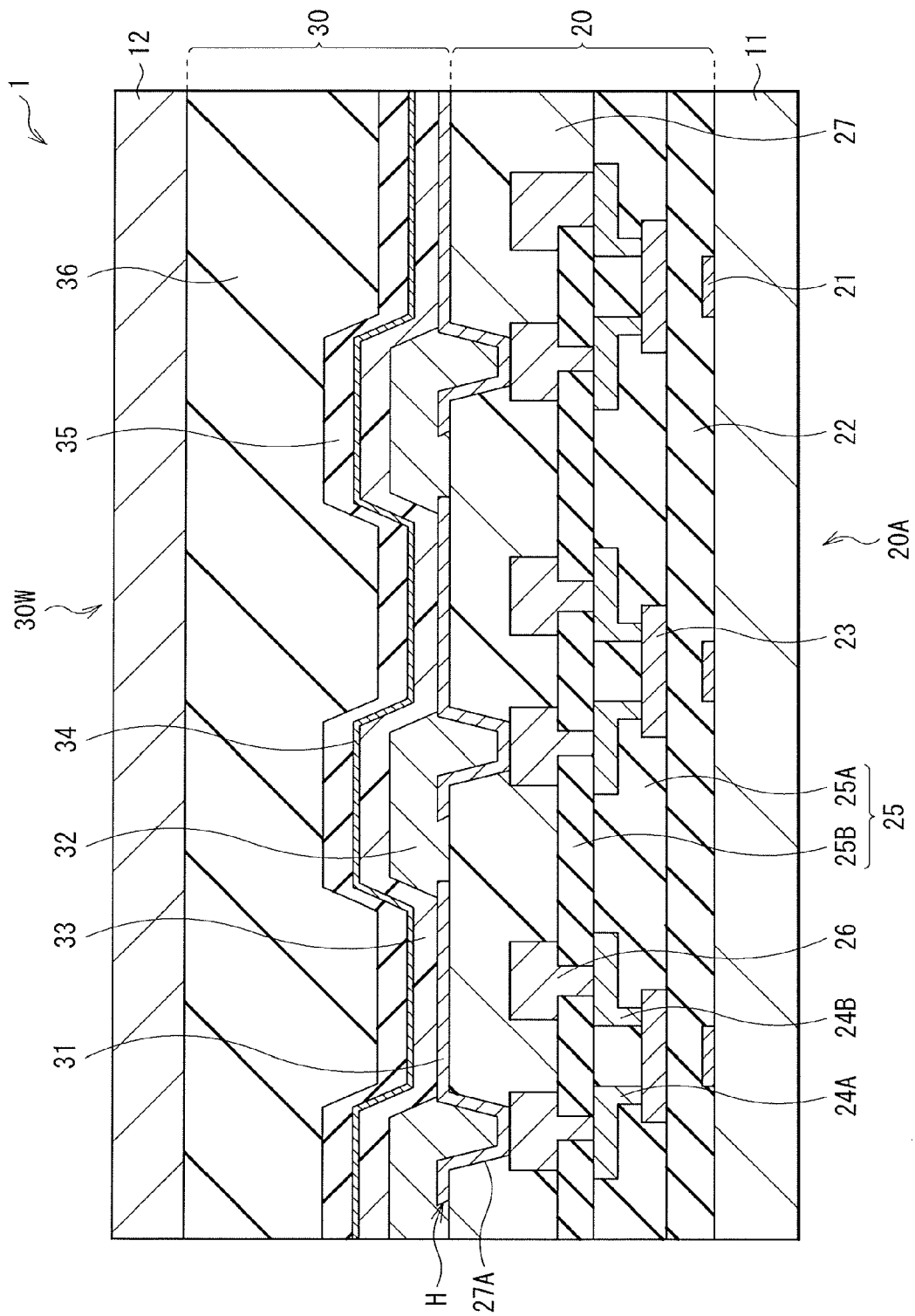
FIG. 1 is a sectional view illustrating a configuration of a display unit according to a first embodiment of the present disclosure.

FIG. 1 illustrates a sectional configuration of a display unit 1 that will be described later according to a first embodiment of the present disclosure. The display unit 1 may be used, for example, as an organic EL television or the like, and has a configuration in which a semiconductor layer 20 and a display layer 30 are laminated on a substrate 11. A plurality of devices including a thin film (a wiring layer, an insulating layer, or the like of an electrode or the like) are formed in the semiconductor layer 20. More specifically, in addition to a thin film transistor (for example, a TFT 20A) as a switching device for selection of a pixel, a capacitor device, wiring lines (such as a scanning line and a signal line), and the like are formed. The TFT 20A in this embodiment may have, for example, an inverted stagger configuration (a so-called bottom gate type), and a channel layer (an oxide semiconductor layer 23) is formed of an oxide semiconductor. It is to be noted that FIG. 1 schematically illustrates a configuration of the display unit 1, and dimensions and a shape of the display unit 1 may be different from actual dimensions and an actual shape.

Examples of the oxide semiconductor forming the oxide semiconductor layer 23 may include a material including two or more kinds selected from a group configured of indium (In), gallium (Ga), zinc (Zn), and tin (Sn). Specific examples of the oxide semiconductor may include an In—Sn—Ga—Zn—O-based material, an In—Ga—Zn—O-based material, an In—Sn—Zn—O-based material, an In-aluminum (Al)—Zn—O-based material, a Sn—Ga—Zn—O-based material, an Al—Ga—Zn—O-based material, a Sn—Al—Zn—O-based material, an In—Zn—O-based material, a Sn—Zn—O-based material, an Al—Zn—O-based material, a Zn-magnesium (Mg)—O-based material, a Sn—Mg—O-based material, an In—Mg—O-based material, an In—Ga—O-based material, an In—O-based material, a Sn—O-based material, and a Zn—O-based material. It is to be noted that, for example, the In—Ga—Zn—O-based material means an oxide including In, Ga, and Zn irrespective of a composition ratio thereof. Moreover, the In—Ga—Zn—O-based material may include an element other than In, Ga, and Zn. Further, an amount of oxygen included in the oxide semiconductor may be preferably excessive in a stoichiometric composition ratio. When oxygen is excessively included, generation of a carrier caused by a loss of oxygen in the oxide semiconductor layer 23 is suppressed. Moreover, as the material of the oxide semiconductor layer 23, a material with a band gap of about 2.5 eV or more may be preferably selected to reduce an off current of the TFT 20A, and a material with a band gap of about 3.0 eV or more may be more preferably selected.

Figure 2:
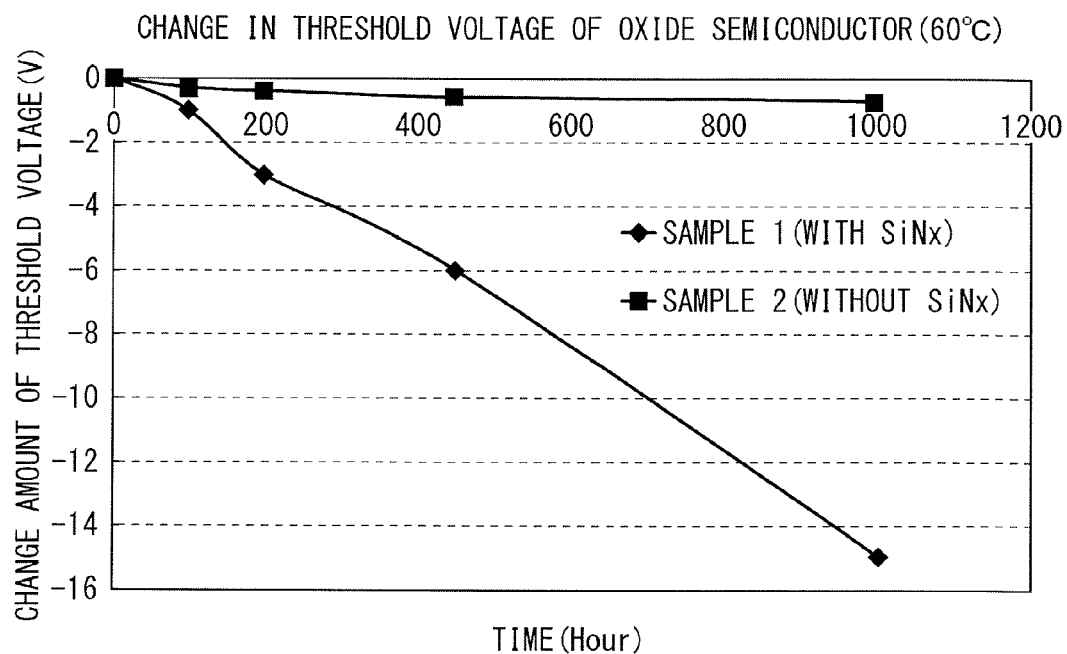
FIG. 2 is a characteristic diagram illustrating variation in threshold voltage of an oxide semiconductor layer.

As described above, the oxide semiconductor is extremely sensitive to hydrogen, and even a small amount of hydrogen may affect properties of the oxide semiconductor. FIG. 2 illustrates variation in threshold voltage of the oxide semiconductor layer 23 in samples 1 and 2 using the oxide semiconductor as a channel. The sample 1 has a configuration formed by forming a TFT with a configuration similar to that of the semiconductor layer 20 illustrated in FIG. 1 and then laminating a pixel electrode 31, an organic layer 33, and a counter electrode 34 in this order on a planarization film 27. The sample 2 has a configuration in which silicon nitride (SiNx, with a film thickness of 5 μm) is further formed on the counter electrode 34 of the configuration of the sample 1. A SiNx film is a film that is permeable to hydrogen or is capable of releasing hydrogen, and is typically used as an insulating film (for example, a protective film 35) in a display unit. When a temperature acceleration test (at 60° C.) is performed on the samples 1 and 2, the threshold voltage hardly varies in the sample 1 in which the SiNx film is not included, and the threshold voltage is shifted by about 15 V or more at 1000 hours in the sample 2 in which the SiNx film is included. Thus, in a display unit provided with the TFT 20A using the oxide semiconductor as a channel has an issue that the threshold voltage of the TFT 20A is apt to vary in structure.

Therefore, in the display unit 1 according to an embodiment of the present disclosure, a hydrogen absorption layer H (a second layer) is provided between the oxide semiconductor layer 23 and a layer (a first layer), such as the SiNx film, that is permeable to hydrogen or is capable of releasing hydrogen to reduce variation in the threshold voltage of the TFT 20A. A configuration of the hydrogen absorption layer H will be described below.

The hydrogen absorption layer H has a hydrogen absorption function, and is provided between the oxide semiconductor layer 23 and the layer (for example, the protective film 35) that is permeable to hydrogen or is capable of releasing hydrogen irrespective of electrical conductivity and electrical insulation. More specifically, for example, in a case where the hydrogen absorption layer H is provided to the semiconductor layer 20, a wiring layer such as a source electrode 24A, a drain electrode 24B, or a wiring line 26, or an insulating layer such as an interlayer insulating film 25 or a planarization film 27 may also serve as the hydrogen absorption layer H. Moreover, in a case where the hydrogen absorption layer H is provided to the display layer 30, for example, any of the pixel electrode 31, the organic layer 33, the counter electrode 34, and a barrier 32 may also serve as the hydrogen absorption layer H. The hydrogen absorption layer H may preferably have a hydrogen absorption capability of $2 \times 10^{17}$ atoms/cm$^2$ or more, and a material capable of absorbing hydrogen in a temperature range (for example, from about −40° C. to about 90° C. both inclusive) in which the display unit 1 operates and is stored may be preferably used.

Examples of hydrogen absorbent may include a hydrogen storage alloy, an oxidizer, organic matter having a double bond in a molecule, and an adsorbent. The hydrogen absorption layer H is formed of one kind or a mixture of a plurality of kinds selected from them. More specifically, for example, the hydrogen absorption layer H may be formed as a metal layer formed of a hydrogen storage alloy with electrical conductivity or an adsorbent, or as an insulating film formed of a mixture of an oxidizer with electrical insulation, particles of the organic matter having a double bond in a molecule, the adsorbent, or a hydrogen absorbent, and a resin.

The hydrogen storage alloy is an alloy having a property of capturing hydrogen, and examples of the hydrogen storage alloy may include an AB2 type alloy and an AB5 type alloy. Specifically, the AB2 type alloy is an alloy using, as a base, an alloy of a transition element such as titanium (Ti), manganese (Mn), zirconium (Zr), or nickel (Ni). Specifically, the AB5 type alloy is an alloy using, as a base, an alloy including niobium (Nb) and/or Zr, and a transition element (such as Ni, cobalt (Co), and aluminum (Al)) having a catalytic effect in a ratio of 1:5. In addition to them, examples of the hydrogen storage alloy may include a Ti-iron (Fe)-based alloy, a vanadium (V)-based alloy, an Mg alloy, a palladium (Pa)-based alloy, a calcium (Ca)-based alloy, and an alloy of Ca and a transition element such as Ni.

Examples of the oxidizer and the organic matter having a double bond in a molecule may include the following materials. As the oxidizer, potassium nitrate, hypochlorous acid, chlorous acid, chloric acid, perchloric acid, halogens, permanganic acid, ceric ammonium nitrate, chromic acid, dichromic acid, peroxides, Tollens' reagent, and the like may be used. As the organic matter having a double bond in a molecule, alkene, a carbonyl compound, and the like may be used. More specifically, RCHO, RCOOR', RCOOH, RCOR'R", RC(O)C(R')CR"R''', RCOCl, $(RCO)_2O$, and the like may be used. It is to be noted that, in a case where the organic matter has high activation energy, any of various catalysts may be used in combination with the organic matter. Examples of catalysts may include an aluminum hydride compound and a boron hydride compound. Moreover, a mixture of an oxide and the organic matter having a double bond in a molecule may produce water as a byproduct when the mixture absorbs hydrogen. Reaction of water with a light-emitting layer or an electron injection layer in the organic layer 33 may cause reduction in luminance; therefore, a water absorbent (a water absorbing material) may be preferably added. Examples of the water absorbing material may include aldehydes and ketones. Specific examples of the water absorbing material may include cyclohexanone and crotonaldehyde, and lithium aluminum hydride may be preferably added to them.

The adsorbent captures hydrogen by physical adsorption. Specific examples of the adsorbent may include zeolite with a large surface area, mesoporous silica, layer silicate, activated carbon, carbon nanotube (CNT), graphite nanocarbon, and fullerene ($C_{60}$).

Moreover, the hydrogen absorption layer H may be formed with use of a mixture of particles of a hydrogen absorbent and a resin. The mixture of the particles of the hydrogen absorbent and the resin may adjust electrical insulation and transparency by adjusting a particle size of the hydrogen absorbent and a concentration of the mixed hydrogen absorbent. As the particles of the hydrogen absorbent, the above-described hydrogen storage alloy, the above-described oxidizer, and the above-described adsorbent may be used. Examples of the resin may include acrylic, polyimide, novolac, and an epoxy resin that have electrical insulation and to which a photosensitive material is added. For example, in a case where the planarization film 27 or the like is formed with use of the mixture of the particles of the hydrogen absorbent and the resin, dispensability, reflectivity and concentration of the hydrogen absorbent in a film may be preferably adjusted as appropriate. In terms of the dispensability of the hydrogen absorbent, a reactive area of the hydrogen absorbent is allowed to be improved by uniformly dispersing the hydrogen absorbent into a resin solvent during film formation. Moreover, in a case where an insulating film (the interlayer insulating film 27) formed of the particles of the hydrogen absorbent and the resin is patterned by UV light or visible light, the hydrogen absorbent may be preferably prepared so as not to block or scatter UV light or visible light. In particular, in a bottom emission display unit illustrated in FIG. 14, a layer formed below the light-emitting layer is desired to have high transparency at which light is not attenuated.

Figure 3:
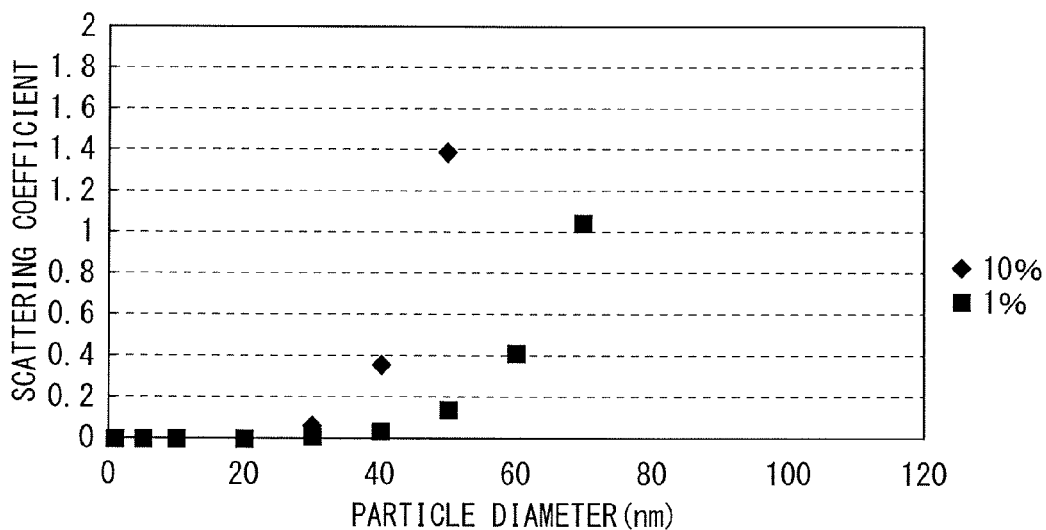
FIG. 3 is a characteristic diagram illustrating a relationship between a particle diameter and a scattering coefficient of a hydrogen absorbent in an i line.
Figure 4:
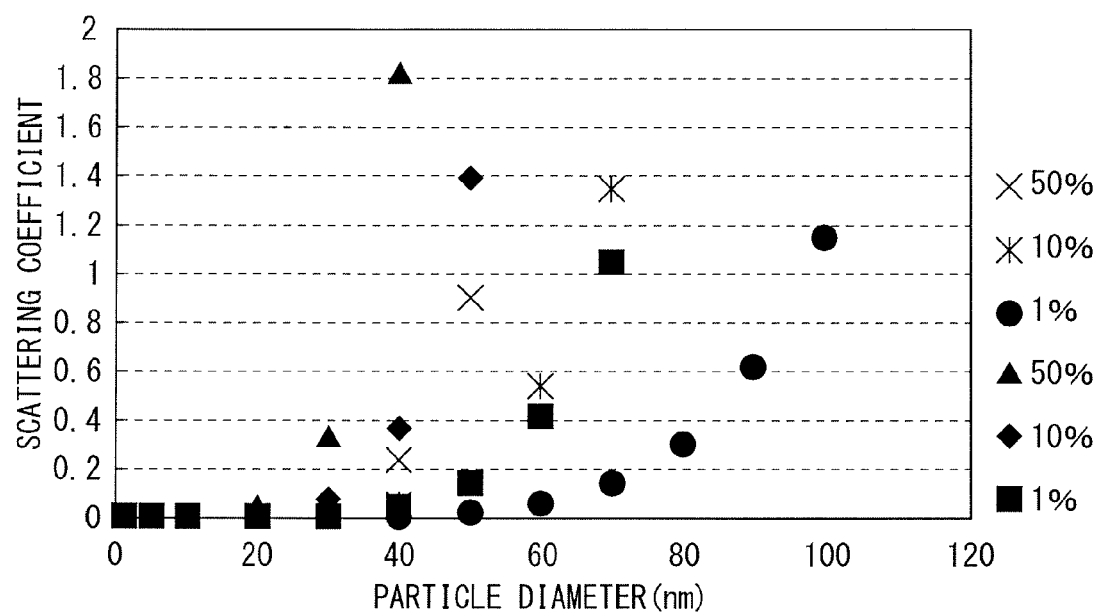
FIG. 4 is a characteristic diagram illustrating a relationship between a particle diameter and a scattering coefficient of a hydrogen absorbent in visible light.

FIGS. 3 and 4 illustrate particle diameters and scattering coefficients in an i line with a shortest wavelength (refer to FIG. 3) and visible light ($\lambda=550$ nm) (refer to FIG. 4) in a typical exposure unit. It is to be noted that the hydrogen absorbent is mixed into polyimide with a volume fraction of 1% or 10% in FIG. 3, and the hydrogen absorbent is mixed into polyimide with a volume fraction of 1%, 10%, or 50% in FIG. 4. As can be seen from FIGS. 3 and 4, when the particle diameter of the hydrogen absorbent is larger than 30 nm, the particle diameter falls outside the Rayleigh scattering region, thereby causing an increase in scattering coefficient. Therefore, the particle diameter of the hydrogen absorbent when the mixture of the hydrogen absorbent and the resin is used may be preferably less than about 30 nm.

Moreover, in a case where an insulating film such as the planarization film 27 is formed of the mixture of the particles of the hydrogen absorbent and the resin, the hydrogen absorbent may preferably have electrical insulation. However, as long as the entire film exhibits electrical insulation (non-conductivity), the hydrogen absorbent may have electrical conductivity. In a case where the hydrogen absorbent with electrical conductivity is used, the concentration of the hydrogen absorbent in the resin may be preferably within a range of about 1 wt % to about 50 wt % both inclusive, and more preferably within a range of about 5 wt % to about 20 wt % both inclusive.

Thus, when the hydrogen absorption layer H (the second layer) formed with use of the above-described materials is disposed between the oxide semiconductor layer 23 and the layer that is permeable to hydrogen or is capable of releasing hydrogen, hydrogen reaching the oxide semiconductor layer 23 is allowed to be reduced. It is to be noted that, as the hydrogen absorption layer H, an existing component (for example, the planarization film 27 or the protective film 35) provided between the oxide semiconductor layer 23 and the layer (for example, the protective film 35) that is permeable to hydrogen or is capable of releasing hydrogen may be used, or another layer may be formed. Respective embodiments and modification examples such as a case where a wiring layer (for example, the pixel electrode 31) also serves as the hydrogen absorption layer H (the first embodiment and Modification Example 1), a case where an insulating layer (for example, the planarization film 27) also serves as the hydrogen absorption layer H (a second embodiment), and the hydrogen absorption layer H is formed in addition to existing layers configuring an display unit (a third embodiment), and the like will be described below.

2. FIRST EMBODIMENT 2-1. Basic Configuration

As described above, FIG. 1 illustrates a sectional configuration of a display unit (the display unit 1) according to the first embodiment of the present disclosure, and in the display unit 1, a display region 110A in which the semiconductor layer 20 and the display layer 30 are laminated on the substrate 11 are provided. In the display region 110A, for example, a plurality of pixels 10 each including, as sub-pixels, a red pixel 10R, a green pixel 10G, and a blue pixel 10B are arranged in a matrix form (refer to FIG. 5). A white light-emitting device 30W configured to emit white light is provided to each of the pixels 10 (10R, 10G, and 10B), and emission light corresponding to each of the pixels 10R, 10G, and 10B is obtained by a color filter (not illustrated). The white light-emitting device 30W may be, for example, an organic EL device in which a light-emitting layer or the like is formed of an organic compound. In this embodiment, the pixel electrode 31 also serves as the hydrogen absorption layer H.

Examples of the substrate 11 may include a high strain point glass substrate, a soda glass ($Na_2O.CaO.SiO_2$) substrate, a borosilicate glass ($Na_2O.B_2O_3.SiO_2$) substrate, a forsterite ($2MgO.SiO_2$) substrate, a lead glass ($Na_2O.PbO.SiO_2$) substrate, a quartz substrate, and various glass substrates, a quartz substrate, and a silicon substrate that each include an insulating film formed on a surface thereof. In addition, a metal foil substrate of aluminum (Al), nickel (Ni), copper (Cu), or stainless of which a surface is subjected to insulation treatment, a paper, and the like may be used. Moreover, a functional film such as a buffer layer for improvement of adhesion or flatness or a barrier film for improvement of a gas barrier property may be formed on these substrates.

Transistors Tr1 and Tr2 for driving or writing, and various kinds of wiring lines are formed in the semiconductor layer 20, and the planarization film 27 is provided on the transistors Tr1 and Tr2 and the wiring lines. Although the transistors Tr1 and Tr2 (hereinafter referred to as "TFTs 20A") may be of a top gate type or a bottom gate type, the bottom gate type TFT 20A will be described here as an example. In the TFT 20A, a gate electrode 21, a gate insulating layer 22, the oxide semiconductor layer 23 (a channel layer) forming a channel region, and a pair of source-drain electrodes (a source electrode 24A and a drain electrode 24B) are formed in this order on the substrate 11. Moreover, an interlayer insulating film 25 (25A and 25B) and a wiring layer 26 are provided as multilayer wiring layers.

The gate electrode 21 has a role in applying a gate voltage to the oxide semiconductor layer 23, and controlling carrier density in the oxide semiconductor layer 23 by the gate voltage. The gate electrode 21 is disposed in a selective region on the substrate 11, and may be made of, for example, any one of simple substrates and alloys of metal such as Al, titanium (Ti), chromium (Cr), cobalt (Co), nickel (Ni), Cu, yttrium (Y), zinc (Zr), molybdenum (Mo), silver (Ag), tantalum (Ta), ruthenium (Ru), and tungsten (W). Alternatively, a laminate of two or more kinds selected from them may be used.

The gate insulating layer 22 with a thickness of, for example, about 50 nm to about 1 μm both inclusive may be provided between the gate electrode 21 and the oxide semiconductor layer 23. As a material of the gate insulating layer 22, a material including small contents of hydrogen, oxygen, and water may be preferable, and the gate insulating layer 22 may be configured of, for example, an insulating film including one or more selected from a group configured of a silicon oxide film (SiO), a silicon nitride film (SiN), a silicon oxynitride film (SiON), an hafnium oxide film (HfO), an aluminum oxide film (AlO), an aluminum nitride film (AlN), a tantalum oxide film (TaO), a zirconium oxide film (ZrO), a hafnium oxynitride film, a hafnium silicon oxynitride film, an aluminum oxynitride film, a tantalum oxynitride film, and a zirconium oxynitride film. The gate insulating layer 22 may have a single-layer configuration, or may have, for example, a laminate configuration using two or more kinds of materials such as SiN and SiO.

The oxide semiconductor layer 23 is formed in an island shape on the gate insulating layer 22, and has a channel region in a position facing the gate electrode 21 between the source electrode 24A and the drain electrode 24B. The thickness of the oxide semiconductor layer 23 may be, for example, within a range of about 5 nm to about 100 nm both inclusive. The oxide semiconductor layer 23 is made of the above-described oxide semiconductor including any of In, Ga, Zn, and the like.

The source electrode 24A and the drain electrode 24B are disposed on the oxide semiconductor layer 23 so as to be separated from each other, and are configured to be electrically connected to the oxide semiconductor layer 23. Materials of the source electrode 24A and the drain electrode 24B may include a metal material, metalloid, and an inorganic semiconductor material. More specifically, in addition to the materials listed as the material of the above-described gate electrode 21, for example, simple substances of metal such as manganese (Mn), palladium (Pd), vanadium (V), gold (Au), and silver (Ag), oxides thereof, nitrides thereof, and alloys thereof may be used. In particular, since Ti, Mn, Zr, Ni, Pd, V, and the like have hydrogen storage capacity, they may be preferable. Alternatively, a laminate of two or more kinds selected from them may be used. In a case where the laminate is used, the laminate may be preferably configured so as to expose a metal material having a hydrogen storage effect such as hydrogen such as Ti.

The interlayer insulating film 25 (25A and 25B) is configured to prevent a short circuit between wiring lines in different layers, for example, between the oxide semiconductor layer 23, and the source electrode 24A and the drain electrode 24B, between the source electrode 24A and the drain electrode 24B, and the wring line 27A, and the like. As a material of the interlayer insulating film 25, a material having electrical insulation, for example, the inorganic insulating materials listed as the material of the above-described gate insulating layer 22 may be used, and a material that does not release hydrogen, oxygen, and water in large amounts may be preferable.

The planarization film 27 is configured to planarize a surface of the substrate 11 on which the TFTs 20A are formed, and may have, for example, a thickness of about 1 μm to about 10 μm both inclusive. As a material of the planarization film 27, in addition to the inorganic insulating materials listed as the material of the above-described gate insulating layer 22, for example, photosensitive resin materials such as a polyimide-based, polyacrylate-based, epoxy-based, cresol novolac-based, polystyrene-based, polyamide-based and fluorine-based organic materials may be used.

The display layer 30 includes the white light-emitting device 30W, and is disposed on the semiconductor layer 20. The white light-emitting device 30W is a light-emitting device formed by laminating the pixel electrode 31, the barrier 32 as an inter-electrode insulating film, the organic layer 22 including a light-emitting layer, and the counter electrode 34 in this order from the semiconductor layer 20. The counter substrate 12 is bonded onto the counter electrode 34 with the protective film 35 and a sealing layer 36 in between. The TFT 20A and the white light-emitting device 30W are configured to be electrically connected to each other through a connection hole 27A formed in the planarization film 27.

The pixel electrode 31 serves as the hydrogen absorption layer H in this embodiment; therefore, the pixel electrode 31 is made of the above-described hydrogen storage alloy such as the AB2 type alloy or the AB2 type alloy. In particular, in a case where the pixel electrode 31 is used as an anode, for example, metal with a high work function such as platinum (Pt), Au, Ag, Cr, W, Ni, Cu, iron (Fe), Co, or Ta, or an alloy thereof (for example, an Ag—Pd—Cu alloy including silver as a main component, about 0.3 wt % to about 1 wt % of Pd, and about 0.3 wt % to about 1 wt % of Cu, or an Al—Nd alloy) may be preferably used. Moreover, in a case where a material with a small work function such as Al or an alloy including Al is used, the material with a small work function may be used as an anode by forming a hole injection layer that will be described later with use of a suitable material to improve a hole injection property. Alternatively, the pixel electrode 31 may be configured of a single layer of one kind selected from the above-described metal materials or a laminate of two or more kinds selected from the above-described metal materials. In a case where the laminate is used, the laminate may be preferably configured to expose the above-described hydrogen storage alloy.

The barrier 32 is configured to secure electrical insulation between the pixel electrode 31 and the counter electrode 34 and to form a light emission region in a desired shape, and may be made of, for example, a photosensitive resin. The barrier 32 is disposed only around the pixel electrode 31, and a region exposed from the barrier 32 of the pixel electrode 31 serves as the light emission region. It is to be noted that, even though the organic layer 33 and the counter electrode 34 are provided on the barrier 32, light is emitted only from the light emission region.

The organic layer 33 may have a configuration formed by laminating, for example, a hole injection layer, a hole transport layer, a light-emitting layer, an electron transport layer, and an electron injection layer in order from the pixel electrode 31. These layers may be provided as necessary. For example, in a case where the light-emitting layer is formed with the addition of a material having an electron transport property, the electron transport layer may be omitted. Moreover, the hole injection layer, the hole transport layer, the light-emitting layer, the electron transport layer, and the electron injection layer may be combined as one unit, and two or three or more units configured of the hole injection layer, the hole transport layer, the light-emitting layer, the electron transport layer, and the electron injection layer may be laminated with a connection layer in between to configure a so-called tandem configuration.

The hole injection layer is configured to enhance hole injection efficiency, and is a buffer layer configured to prevent leakage. The hole transport layer is configured to enhance hole transport efficiency to the light-emitting layer. The light-emitting layer is configured to emit light by the recombination of electrons and holes in response to the application of an electric field. In this embodiment, the light-emitting layer has a configuration that emits white light. White light may be obtained, for example, by laminating a blue light-emitting layer configured to emit blue light and a yellow light-emitting layer configured to emit yellow light, or by laminating a red light-emitting layer configured to emit red light, a green light-emitting layer configured to emit green light, and the blue light-emitting layer. The electron transport layer is configured to enhance electron transport efficiency to the light-emitting layer. The electron injection layer is configured to enhance electron injection efficiency. The hole injection layer (the hole transport layer) and the electron injection layer (the electron transport layer) may preferably have a substantially equal thickness; however, the thicknesses of the hole injection layer (the hole transport layer) and the electron injection layer (the electron transport layer) are not specifically limited as long as supply balance of holes and electrons to the light-emitting layer is maintained. For example, the electron injection layer (the electron transport layer) may be thicker than the hole injection layer (the hole transport layer). Thus, holes and electrons are allowed to be sufficiently supplied to the light-emitting layer in proper quantities, and drive degradation is reduced, and light emission lifetime is improved.

The counter electrode 34 may be made of a material with light transmittance, for example, an oxide of indium and tin (ITO), InZnO (indium zinc oxide), zinc oxide (ZnO) and Al, or an alloy of Al, Mg, calcium (Ca) or Na. In particular, since an alloy of magnesium and silver (an Mg—Ag alloy) has both electrical conductivity and small absorption in a thin film, the Mg—Ag alloy may be preferable. A ratio of magnesium to silver in the Mg—Ag alloy is not specifically limited; however, the ratio may be preferably within a range of Mg:Ag=about 20:1 to about 1:1 both inclusive in film thickness ratio. Alternatively, the material of the counter electrode 34 may be an alloy of aluminum (Al) and lithium (Li) (an Al—Li alloy). The thickness of the counter electrode 34 may be, for example, within a range of about 10 nm to about 3000 nm both inclusive.

The protective film 35 may have, for example, a thickness of about 1 μm to about 10 μm both inclusive, and may be formed of an insulating material such as aluminum oxide ($AlO_x$), silicon oxide (SiO), or silicon oxynitride (SiON). As an insulating material other than the above-described material, silicon nitride ($SiN_x$) that releases a larger amount of hydrogen than other materials but is suitable as a protective film of the organic layer 33 may be used. As will be described in detail later, the protective film 35 may be formed by, for example, a sputtering method or a CVD (Chemical Vapor Deposition) method, and hydrogen is incorporated in the protective film 35 during film formation. Hydrogen included in the protective film 35 is released with time to be diffused into the semiconductor layer 20, thereby resulting in a cause of deterioration in TFT characteristics. It is to be noted that the protective film 35 may be omitted, and in such a case, the counter electrode 34 corresponds to the first layer.

The sealing layer 36 is configured to prevent entry of water from outside into the organic layer 33 and to enhance mechanical strength. The sealing layer 36 may preferably have, for example, a thickness of about 3 μm to about 20 μm both inclusive, and more preferably a thickness of about 5 μm to about 15 μm both inclusive. In a case where the thickness is smaller than about 3 μm, foreign matter mixed during sealing may apply pressure to the light-emitting device 30W to cause a dark dot such as pixel missing. In a case where the thickness is thicker than about 20 μm, a distance between the light-emitting layer and a color filter (not illustrated) disposed on the counter substrate 12 that will be described later is increased, and deterioration in viewing angle such as color mixture may be caused accordingly. Moreover, the smaller the refractive index difference is, the higher the light extraction efficiency of an interface between the sealing layer 36 and the protective film 35 has; therefore, the refractive index of the sealing layer 36 may be preferably, for example, about 1.7 or more. Further, the sealing layer 36 may preferably have, for example, a transmittance of about 80% or more in the display region 110A; however, the transmittance in a peripheral region 110B (refer to FIG. 5) is not specifically limited.

The counter substrate 12 is located on a side closer to the counter electrode 34 of the white light-emitting device 30W, and is configured to seal the white light-emitting device 30W together with an adhesive layer (not illustrated). The counter substrate 12 may preferably use a material allowing light emitted from the white light-emitting device 30W to pass therethrough, for example, various kinds of glass substrates, the quartz substrate, and the like listed as the material of the above-described substrate 11. For example, a light-shielding film (not illustrated) may be provided as a color filter and a black matrix to the counter substrate 12 to extract light emitted from the white light-emitting device 30W and to improve contrast.

The color filter includes a red filter, a green filter, and a blue filter (all not illustrated) that are arranged in order corresponding to the pixels 10R, 10G, and 10B, respectively. The red filter, the green filter, and the blue filter are formed in a rectangular shape without space therebetween. Each of the red filter, the green filter, and the blue filter is made of a resin into which a pigment is mixed, and is adjusted by selecting the pigment so as to have high light transmittance in a wavelength range of target red, green, or blue and low light transmittance in other wavelength ranges. It is to be noted that, for example, even in a case where corresponding light-emitting devices 30R, 30G, and 30B are provided to the pixels 10R, 10G, and 10B, respectively, when the color filter is provided, color purity is allowed to be enhanced, and a color gamut is allowed to be improved.

The light-shielding film may be configured of, for example, a black resin film into which a black colorant is mixed and that has optical density of about 1 or more, or a thin film filter using interference of a thin film. In particular, the light-shielding film may be preferably configured of the black resin film, because the light-shielding film is allowed to be formed easily at low cost. The thin film filter may be configured, for example, by laminating one or more thin films made of metal, a metal nitride, or a metal oxide, and is configured to attenuate light with use of interference of the thin film. Specific example of the thin film filter may be a thin film filter configured by alternately laminating chromium and chromium (III) oxide ($Cr_2O_3$).

2-2. Manufacturing Method

The semiconductor layer 20 and the display layer 30 may be formed with use of a typical method that will be described below. First, a metal film is formed on an entire surface of the substrate 11 with use of, for example, a sputtering method or a vacuum deposition method. Next, the metal film is patterned with use of, for example, photolithography and etching to form the gate electrode 21. Then, the gate insulating layer 22 and the oxide semiconductor layer 23 are formed on entire surfaces of the substrate 11 and the gate electrode 21. More specifically, the entire surface of the substrate 11 is coated with for example, a PVP (polyvinylpyrrolidone) solution as a gate insulating layer material by, for example, a spin coating method, and is dried. Thus, the gate insulating layer 22 is formed. Next, the gate insulating layer 22 is coated with an oxide semiconductor. After that, the oxide semiconductor with which the gate insulating layer 22 is coated is heated to form the oxide semiconductor layer 23 on the gate insulating layer 22.

Next, after the interlayer insulating film 25A is formed on the oxide semiconductor layer 23, the source electrode 24A and the drain electrode 24B are formed on the interlayer insulating film 25A so as to be electrically connected to the oxide semiconductor layer 23. More specifically, for example, a Ti film is formed with use of, for example, a sputtering method. Then, the source electrode 24A and the drain electrode 24B are formed by etching with use of, for example, a photolithography method. Next, the interlayer insulating film 25B and the wiring line 26 are formed in order on the source electrode 24A, the drain electrode 24B, and the interlayer insulating film 25A.

Then, after the planarization film 27 is formed on the interlayer insulating film 25B and the wiring line 26, the pixel electrode 31 functioning as the hydrogen absorption layer H is provided. More specifically, after, for example, polyimide is applied, the planarization film 27 is patterned in a predetermined shape by exposure and development, and the connection hole 27A is formed, and the planarization film 27 is fired. Next, a metal film made of any one of the above-described hydrogen storage alloys is formed on the planarization film 27 by, for example, a sputtering method, and then a portion located in a predetermined position of the metal film is selectively removed by, for example, wet etching to form the pixel electrodes 31 separated from one another for each of the pixels 10R, 10G, and 10B.

Next, the organic layer 33 including the light-emitting layer and the counter electrode 34 are formed with use of, for example, a physical vapor deposition method (a PVD method) such as a vacuum evaporation method, any of various kinds of printing methods, a laser transfer method, or the like. Then, the protective film 35 made of, for example, SiNx is formed on the counter electrode 34 with use of, for example, a CVD method in which, for example, silane and ammonia gas react with each other. Further, the sealing layer 36 is formed on the protective film 35.

Finally, the adhesive layer (not illustrated) is formed on the sealing layer 36, and the counter substrate 12 including the color filter and the black matrix is bonded to the sealing layer 36 with the adhesive layer in between. Thus, the display unit 1 illustrated in FIG. 1 is completed.

2-3. Entire Configuration of Display Unit

Figure 5:
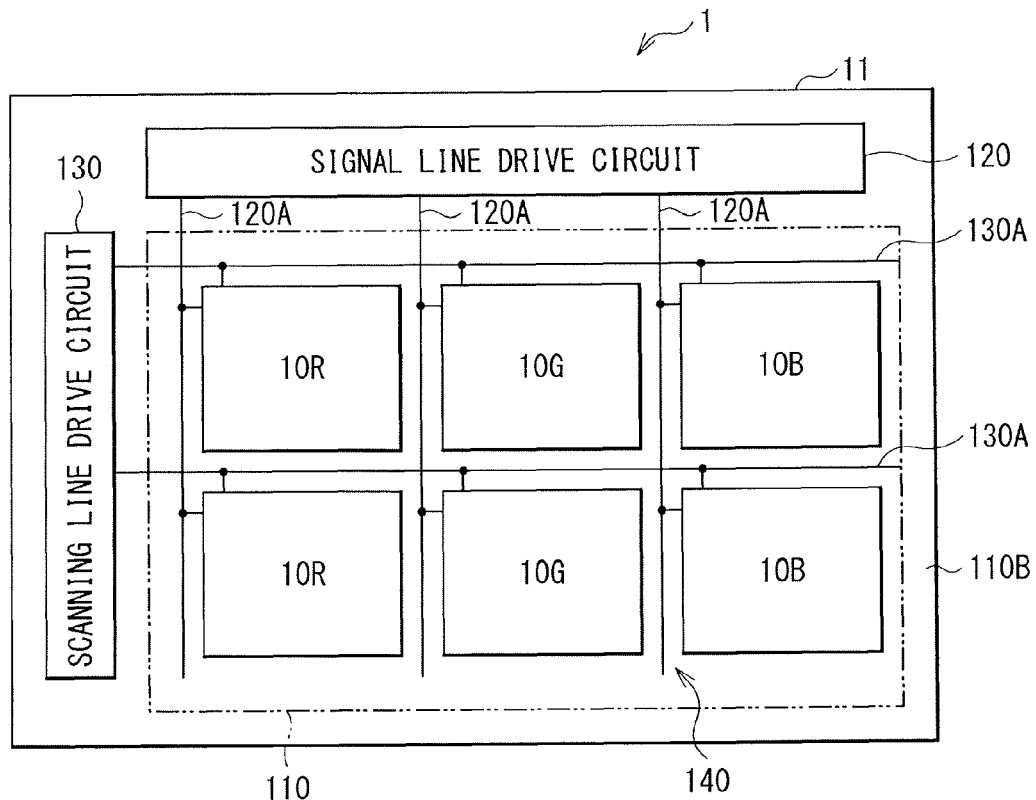
FIG. 5 is a plan view illustrating an entire configuration of the display unit illustrated in FIG. 1.

FIG. 5 illustrates an example of a planar configuration of the entire display unit illustrated in FIG. 1. In the display unit 1, the display region 110A in which a plurality of pixels 10 (10R, 10G, and 10B) are arranged in a matrix form and the peripheral region 110B located around (on an outer edge side or on an outer periphery side of) the display region 110A are provided. A signal line drive circuit 120 and a scanning line drive circuit 130 as drivers for image display are provided to the peripheral region 110B.

Figure 6:
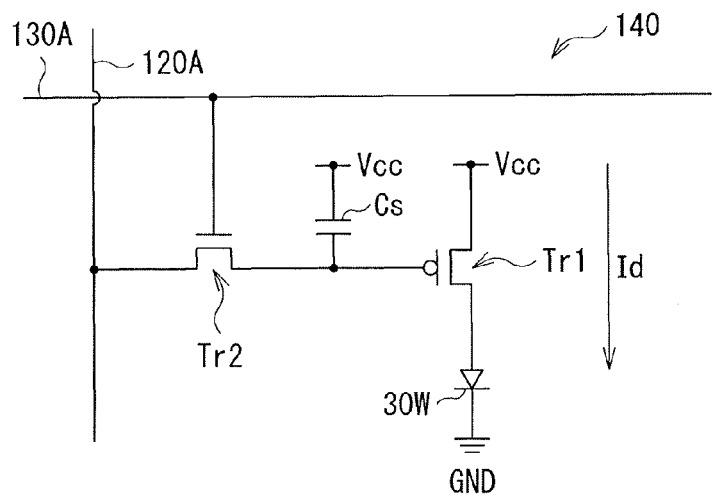
FIG. 6 is a diagram illustrating an example of a pixel drive circuit illustrated in FIG. 5.

A pixel drive circuit 140 is provided in the display region 110A. FIG. 6 illustrates an example of the pixel drive circuit 140 (an example of a pixel circuit of each of the red pixel 10R, the green pixel 10G, and the blue pixel 10B). The pixel drive circuit 140 is an active type drive circuit formed in the semiconductor layer 20 that is formed below the pixel electrode 31. The pixel drive circuit 140 includes the driving transistor Tr1, the writing transistor Tr2, and a capacitor (a retention capacitor) Cs located between these transistors Tr1 and Tr2. The pixel drive circuit 140 further includes a light-emitting device connected in series to the driving transistor Tr1 between a first power supply line (Vcc) and a second power supply line (GND). In other words, the light-emitting device (the white light-emitting device 30W) is provided in each of the red pixel 10R, the green pixel 10G, and the blue pixel 10G. Each of the driving transistor Tr1 and the writing transistor Tr2 is configured of a typical TFT, and the configuration of the TFT may be of the above-described bottom gate type or may have a stagger configuration (a top gate type) that will be described later. The configuration of the TFT is not specifically limited.

In the pixel drive circuit 140, a plurality of signal lines 120A are arranged along a column direction, and a plurality of scanning lines 130A are arranged along a row direction. An intersection of each signal line 120A and each scanning line 130A corresponds to one of the red pixel 10R, the green pixel 10G, and the blue pixel 10B. Each of the signal lines 120A is connected to the signal line drive circuit 120, and an image signal is supplied from the signal line drive circuit 120 to a source electrode of the writing transistor Tr2 through the signal line 120A. Each of the scanning lines 130A is connected to the scanning line drive circuit 130, and a scanning signal is sequentially supplied from the scanning line drive circuit 130 to a gate electrode of the writing transistor Tr2 through the scanning line 130A.

In the display unit 1, the scanning signal is supplied from the scanning line drive circuit 130 to each of the pixels 10 through the gate electrode of the writing transistor Tr2, and the image signal supplied from the signal line drive circuit 120 is retained in the retention capacitor Cs through the writing transistor Tr2. In other words, on-off control of the driving transistor Tr1 is performed in response to the signal retained in the retention capacitor Cs, and a drive current Id is thereby injected into the white light-emitting device 30W to allow the light-emitting device 30W to emit light by the recombination of holes and electrons. This light is multiply-reflected between the pixel electrode 31 and the counter electrode 34, or reflected light from the pixel electrode 31 and light emitted from the light-emitting layer reinforce each other by interference, and the light passes through the counter electrode 34 and the counter substrate 12 to be extracted.

1-3. Functions and Effects

As described above, since the oxide semiconductor is extremely sensitive to hydrogen, characteristics of a TFT using the oxide semiconductor as a channel layer is affected even by a small amount of hydrogen. On the other hand, as with this embodiment, an organic EL display unit including an organic EL device as a light-emitting device includes a large amount of hydrogen. Therefore, in a case where the oxide semiconductor is used as a channel of the TFT configuring the organic EL display unit, there is an issue that the oxide semiconductor layer is apt to be exposed to hydrogen, thereby causing deterioration in display characteristics. Examples of a hydrogen release source in the organic EL display unit may include a film configuration formed in a chamber, alkali metal or alkali earth metal forming the organic EL light-emitting device, foreign matter mixed during film formation, and a crack caused by foreign matter.

The film configuration formed in the chamber may apply to, for example, a film formed by a sputtering method or a CVD method, i.e., a large number of configurations configuring a TFT or a light-emitting device. Typically, each layer (each film) of the TFT or the light-emitting device is formed in a chamber under a vacuum atmosphere. However, it is difficult to completely remove hydrogen with a small number of molecules from a pump used to form the vacuum atmosphere. Moreover, water adhered to a substrate, a mask, a target, a wall surface of the chamber, or the like is altered to generate hydrogen. Thus, a certain amount of hydrogen is included in the chamber under the vacuum atmosphere, and the hydrogen is incorporated in a film during film formation. Hydrogen in the film is released to outside of the film by environmental change such as change with time or change in temperature, thereby causing deterioration in properties of the oxide semiconductor.

Examples of alkali metal or alkali earth metal included in the organic EL light-emitting device may include materials of the counter electrode 34 as a cathode, the electron injection layer, and the electron transport layer. Alkali metal and alkali earth metal have a small work function and a low energy barrier against LUMO of an organic material; therefore, alkali metal and alkali earth metal are allowed to improve light emission efficiency. However, alkali metal and alkali earth metal are easily oxidized by oxygen and water. In particular, in a case where alkali metal and alkali earth metal are oxidized by water, hydrogen is generated, thereby causing deterioration in properties of the oxide semiconductor, as described above.

The foreign matter mixed during film formation and the crack caused by the foreign matter serve as entry pathways of oxygen or water from the counter substrate 34 or the like around the foreign matter or the crack to the hydrogen release source. Oxygen or hydrogen reaching the counter electrode 34 through the foreign matter or the crack reacts with alkali metal or the like forming the counter substrate 34 or the like to generate hydrogen. The generated hydrogen causes deterioration in properties of the oxide semiconductor around the foreign matter or the crack through the foreign matter or the crack. Accordingly, the display unit suffers a display defect such as display unevenness caused by partial reduction in luminance.

It is to be noted that entry of oxygen or water caused by the foreign matter, the crack, or the like is preventable by forming a protective film (for example, the above-described protective film 35) on the light-emitting device. However, in a case where the foreign matter, the crack, or the like is covered with the protective film, it is necessary for the protective film to have a coverage property and a certain or larger film thickness. The certain or larger film thickness is advantageous in that a pin hole is prevented; however, when film formation speed is too slow, productivity may be impaired. Moreover, there is an issue that the protective film itself is apt to release hydrogen or oxygen.

As a method of capturing and removing hydrogen entering the oxide semiconductor layer, for example, there may be considered a method of forming a gate insulating film in contact with the oxide semiconductor layer as a laminate film formed by laminating a hydrogen permeable film configured to diffuse hydrogen and a hydrogen capture film configured to capture hydrogen. The hydrogen permeable film may be formed with use of, for example, silicon oxynitride or silicon oxide, and the hydrogen capture film may be formed with use of, for example, indium nitride or an oxygen-free nitride including indium. The hydrogen permeable film and the hydrogen capture film are allowed to reduce a hydrogen concentration in proximity to an interface of the oxide semiconductor and uniformize a donor concentration by placing the hydrogen permeable film closer to the oxide semiconductor layer.

However, hydrogen absorption capability of the laminate film with such a configuration is not sufficient. Hydrogen elimination amounts of the organic layer including hydrogen and including the light-emitting layer that may be a generation source, an electrode formed of alkali metal or alkali earth metal, and a protective film (SiNx film) formed by a CVD method that are formed so as to have film thicknesses equivalent to those in a typical display unit (about 300 nm, about 10 nm, and about 5 µm, respectively) are about $5 \times 10^{14}$ atoms/cm$^2$, about $2 \times 10^{17}$ atoms/cm$^2$, and about $6 \times 10^{18}$ atoms/cm$^2$, respectively. On the other hand, the hydrogen capture film of the above-described laminate film has a hydrogen acceptable amount of about 2 to $3 \times 10^{16}$ atoms/cm$^2$ in a case where an upper limit of its film thickness is about 500 nm in terms of productivity. Thus, the concentration of hydrogen when a semiconductor film is formed by sputtering is allowed to be adjusted by the hydrogen capture film; however, capability of absorbing hydrogen that is released from the organic layer or the protective film with time is not sufficient. Moreover, when the concentration of hydrogen included in the hydrogen capture film increases more than the hydrogen acceptable amount, a film including indium such as the hydrogen capture film may rapidly increase electrical conductivity to bring the oxide semiconductor located around the film into conduction.

Therefore, in the display unit according to this embodiment, the wiring layer (the pixel electrode 31 in this case) provided between the oxide semiconductor layer 23 and a layer capable of releasing hydrogen (for example, the organic layer 33 including the light-emitting layer, the protective film 35, or the like) is formed of the hydrogen storage alloy to serve as the hydrogen absorption layer H. The material with electrical conductivity such as the hydrogen storage alloy has higher hydrogen absorption capability than a material with electrical insulation forming the above-described hydrogen capture film. Therefore, the oxide semiconductor layer is less likely to be exposed to hydrogen released from inside or entering from outside by change with time or environmental change after film formation of respective layers configuring the display unit.

As described above, in this embodiment, the pixel electrode 31 disposed between the oxide semiconductor layer 23 and the organic layer 33 capable of releasing hydrogen, the counter electrode 34, or the protective film 34 is formed of the hydrogen absorbent with electrical conductivity (for example, a hydrogen storage alloy with high hydrogen absorption). Therefore, the pixel electrode 31 functions as the hydrogen absorption layer H. In other words, hydrogen released from inside or entering from outside by change with time or environmental change is allowed to be prevented from reaching the oxide semiconductor layer 23, and deterioration in characteristics of the oxide semiconductor layer 23 is allowed to be reduced. Therefore, the display unit having high resistance to hydrogen and improved reliability, and an electronic apparatus including the display unit are allowed to be maintained steady.

A modification example (Modification Example 1) of the above-described first embodiment, second to fourth embodiments, and the like will be described below. It is to be noted that, in the following description, like components are denoted by like numerals as of the first embodiment and will not be further described.

3. MODIFICATION EXAMPLE 1

Figure 7:
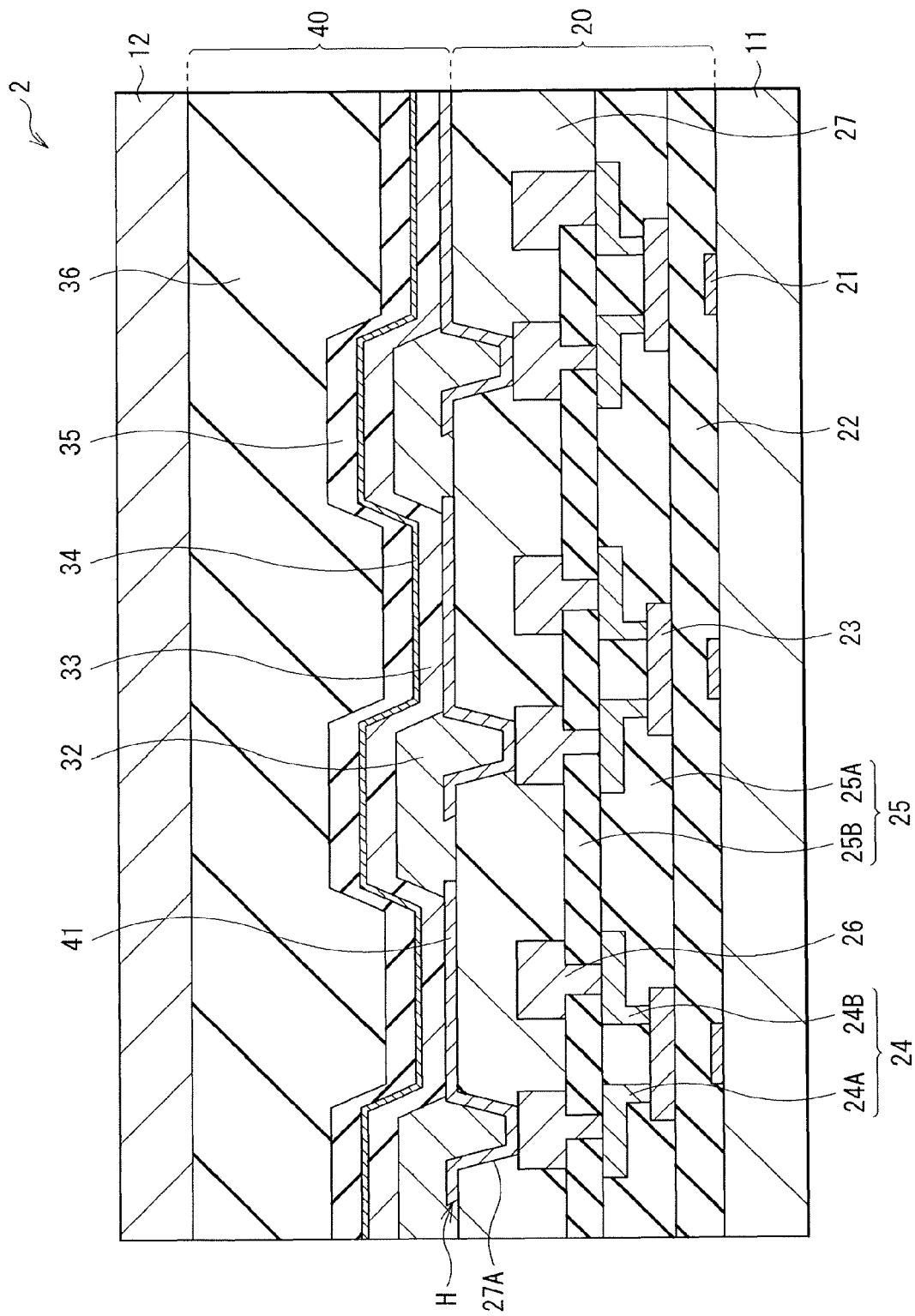
FIG. 7 is a sectional view illustrating a configuration of a display unit 2 according to Modification Example 1 of the present disclosure.
Figure 8:
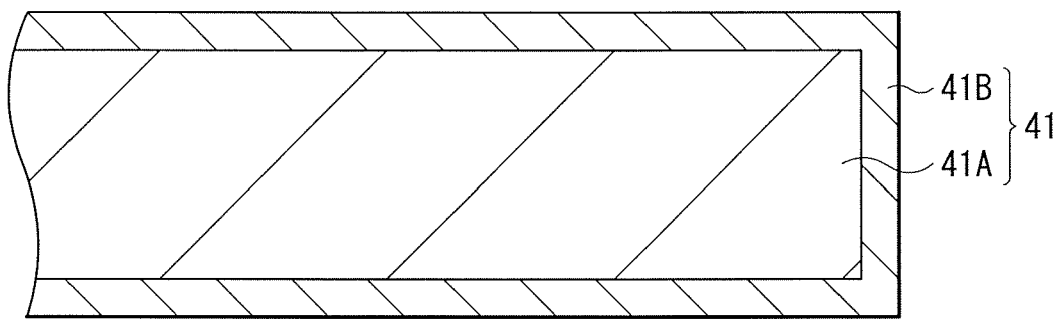
FIG. 8 is a sectional view illustrating a configuration of a pixel electrode illustrated in FIG. 7.

FIG. 7 illustrates a sectional configuration of a display unit (a display unit 2) according to the modification example of the above-described first embodiment. As illustrated in FIG. 8, in the display unit 2, a conductive layer 41A located in an inner portion of a wiring layer (a pixel electrode 41 in this case) and a conductive layer 41B located in an outer portion of the wiring layer are formed of different materials. In this modification example, the conductive layer 41B disposed in the outer portion of the pixel electrode 41, i.e., on a surface of the conductive layer 41A is formed of the hydrogen absorbent, and functions as the hydrogen absorption layer H. The display unit 2 has a configuration similar to that of the display unit 1 according to the first embodiment, except for this point, and functions and effects of the display unit 2 are similar to those in the display unit 1 according to the first embodiment. It is to be noted that one or more surfaces of the conductive layer 41B may function as the hydrogen absorption layer H.

In this modification example, as described above, the pixel electrode 41 is configured of the conductive layer 41A and the conductive layer 41B disposed on the surface of the conductive layer 41A. The conductive layer 41A is made of a typical electrode material, for example, an inexpensive low-resistance material such as Al, Fe, Ag, Au, or Cu. The conductive layer 41B is made of the hydrogen storage alloy such as the above-described AB2 type alloy or the above-described AB5 type alloy.

Thus, in this modification example, an inner portion and an outer portion of the pixel electrode 41 are made of different conductive materials, and the outer portion, i.e., the conductive layer 41B exposed on a surface of the pixel electrode 41 is formed of the hydrogen storage alloy to serve as the hydrogen absorption layer H. Therefore, since the inexpensive low-resistance material is allowed to be used for the conductive layer 41A located in the inner portion of the pixel electrode 41, in addition to the effects in the above-described first embodiment, an effect of being capable of reducing cost is produced. It is to be noted that, when materials with an equal etching property are selected as conductive materials forming the conductive layer 41A and the conductive layer 41B, an increase in the number of processes is allowed to be reduced.

4. SECOND EMBODIMENT

Figure 9:
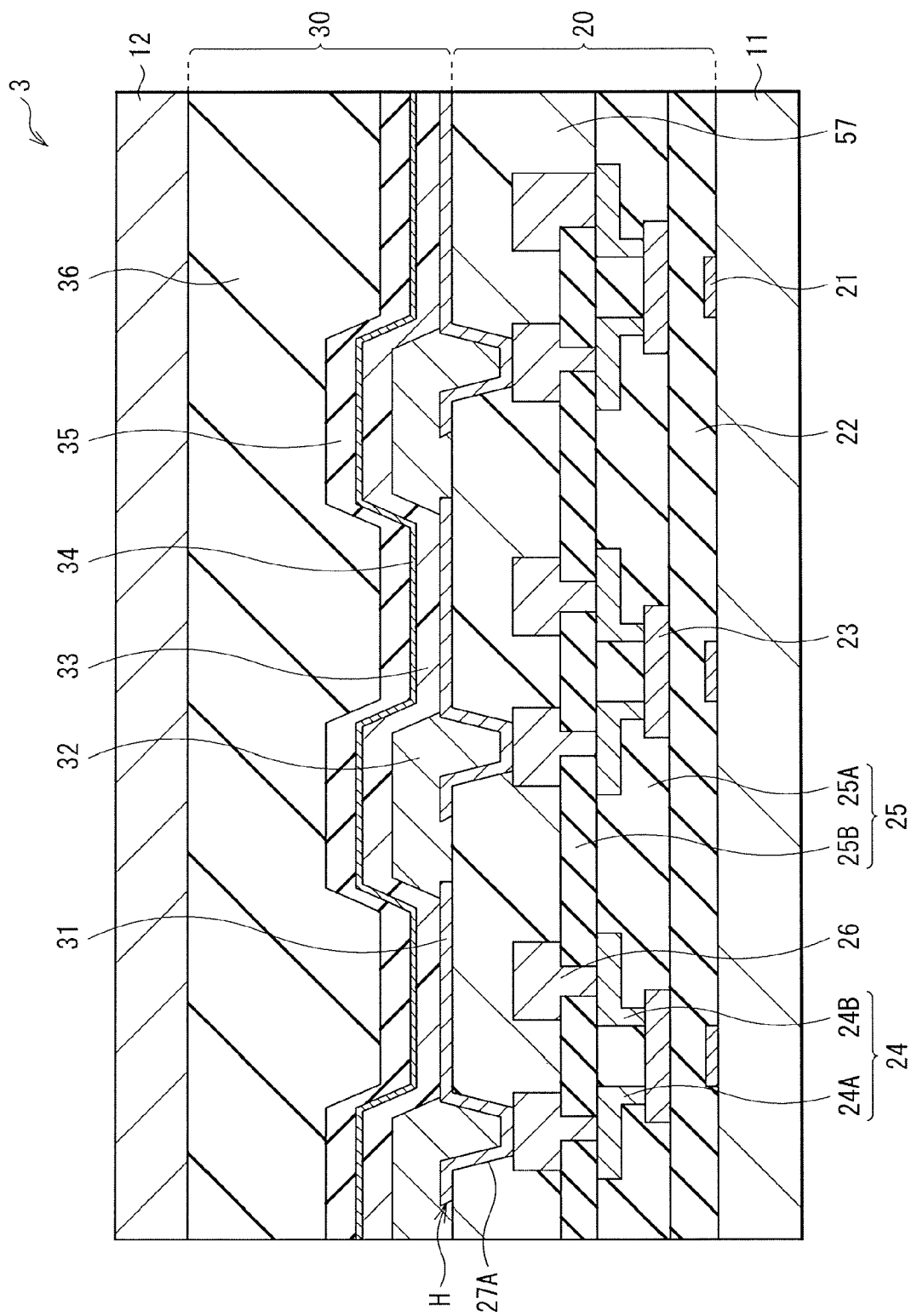
FIG. 9 is a sectional view illustrating a configuration of a display unit according to a second embodiment of the present disclosure.

FIG. 9 illustrates a sectional configuration of a display unit (a display unit 3) according to the second embodiment of the present disclosure. The display unit 3 differs from the above-described first embodiment and the above-described Modification Example 1 in that an insulating layer (a planarization film 57 in this case) also serves as the hydrogen absorption layer H.

The planarization film 57 in this embodiment is formed by mixing particles of a hydrogen absorbent and a resin. As the particles of the hydrogen absorbent, the above-described hydrogen storage alloy, a mixture of an oxidizer and organic matter having a double bond in a molecule, and an adsorbent may be used. As the resin, the photosensitive resin materials (for example, the polyimide-based, polyacrylate-based, epoxy-based, cresol novolac-based, polystyrene-based, polyamide-based, and fluorine-based organic materials) listed as the material of the above-described planarization film 27 may be used. As described above referring to FIGS. 3 and 4, the particle diameter of the hydrogen absorbent may be preferably smaller than about 30 nm. Moreover, in a case where particles of a hydrogen absorbent with electrical conductivity such as the hydrogen storage alloy is used, when the particle concentration of the hydrogen absorbent in the resin is within a range of about 1% to about 50% both inclusive, electrical insulation of the planarization film 57 is allowed to be maintained.

It is to be noted that the planarization film 57 is allowed to be formed with use of a typical film forming method after mixing the particles of the hydrogen absorbent into a photosensitive resin as a base material. Moreover, the smaller the particle diameter of the hydrogen absorbent mixed into the planarization film 57 is, the more the hydrogen absorption area of the particles of the hydrogen absorbent is allowed to be improved. For example, when the planarization film 57 is formed by using a liquid hydrogen absorbent and allowing the liquid hydrogen absorbent to be compatible with the resin as a base material, hydrogen is allowed to react in each molecule of the resin forming the planarization film 57. The planarization film 57 using the liquid hydrogen absorbent is obtained by the following processes.

Figure 10A:
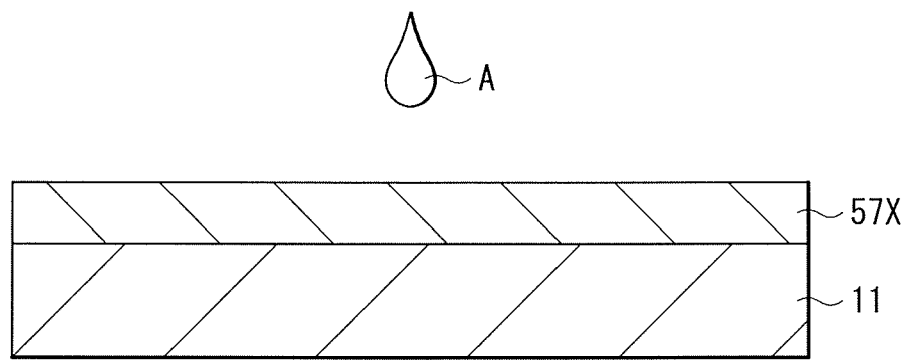
FIG. 10A is a schematic view illustrating an example of a method of manufacturing a planarization film illustrated in FIG. 9.
Figure 10B:
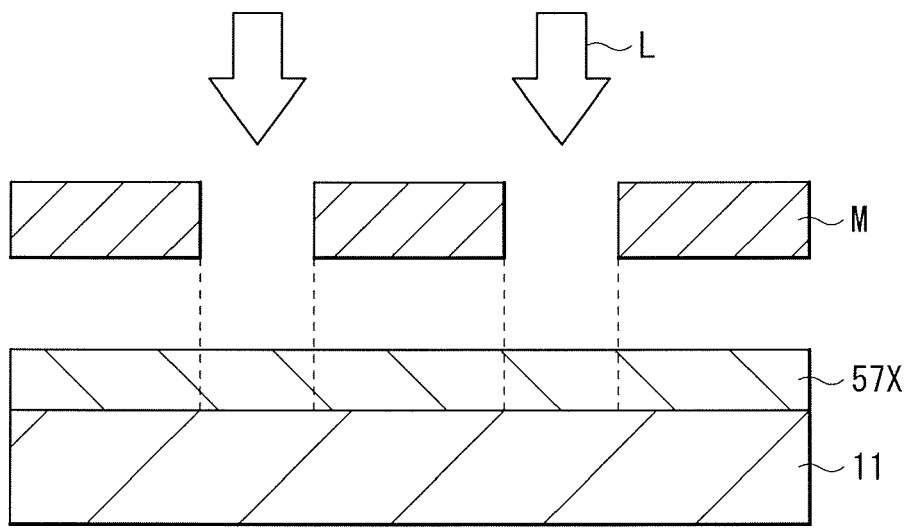
FIG. 10B is a diagram following FIG. 10A.
Figure 10C:
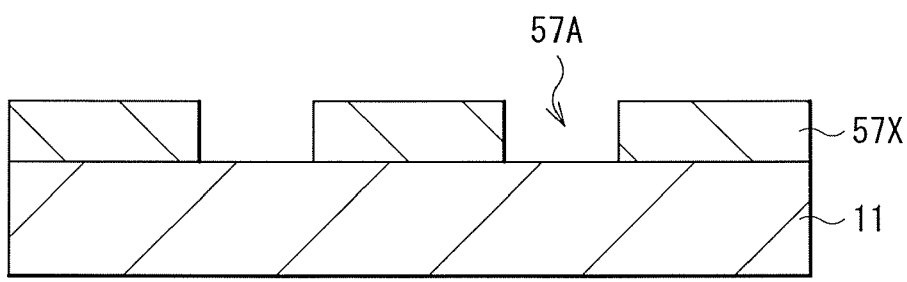
FIG. 10C is a diagram following FIG. 10B.

First, as illustrated in FIG. 10A, a substrate is coated with a mixed liquid A formed by mixing the resin and the hydrogen absorbent by, for example, a spin coating method, and then prebake is performed to evaporate a solvent as appropriate, thereby forming a planarization film 57X. Next, as illustrated in FIG. 10B, a mask M is placed on the planarization film 57X, and exposure is performed with use of UV light or visible light with a short wavelength. Then, as illustrated in FIG. 10C, development is performed to process the planarization film 57X into a predetermined pattern (a connection hole 57A or the like), and then post-bake is performed to form the planarization film 57.

Moreover, a water absorbing material may be preferably added to the planarization film 57. The planarization film 57 is in contact with the light-emitting device 30W, and as described above, the counter electrode 34 and the electron transport layer and the electron injection layer in the organic layer 33 that configure the light-emitting device 30W are formed of alkali metal or alkali earth metal, and the alkali metal or the like reacts with water to generate hydrogen. Therefore, when the water absorbing material is added to the planarization film 57 in contact with the light-emitting device 30W, reaction of alkali metal or the like with water is allowed to be suppressed, thereby suppressing generation of hydrogen. Examples of the water absorbing material may include a water absorbing material using hydrolysis of metal alkoxide and a superabsorbent polymer such as sodium polyacrylate in addition to the above-described adsorbents such as zeolite, mesoporous silica, layer silicate, activated carbon, CNT, graphite nanocarbon, and $C_{60}$.

As described above, in this embodiment, the insulating film (the planarization film 57 in this case) configuring the display unit 2 is formed by mixing the particles of the hydrogen absorbent and the resin so as to also serve as the hydrogen absorption layer H. Thus, hydrogen released from the protective film 35 or the like formed by a CVD method or the like is allowed to be captured before reaching the oxide semiconductor layer 23; therefore, deterioration in properties of the oxide semiconductor is allowed to be reduced. In other words, effects similar to those in the first embodiment are allowed to be obtained.

Moreover, in this embodiment, a surface area of the hydrogen absorbent is increased by using the hydrogen absorbent in a particle form. Therefore, compared to a case where an entire film is formed of the hydrogen absorbent as with the above-described first embodiment, a large amount of hydrogen is allowed to be adsorbed with a small amount of the hydrogen absorbent, and cost is allowed to be reduced.

5. THIRD EMBODIMENT

Figure 11:
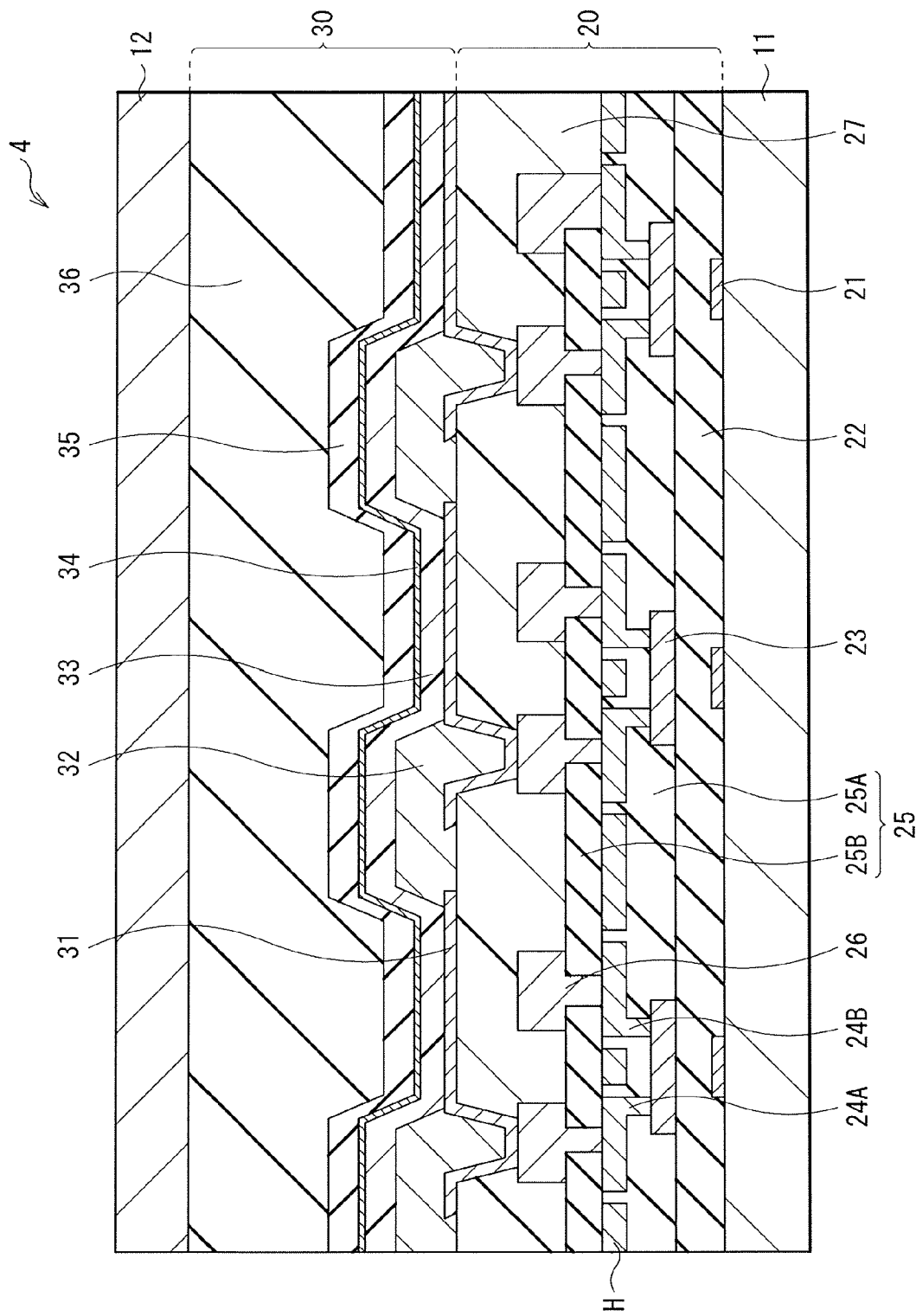
FIG. 11 is a sectional view illustrating a configuration of a display unit according to a third embodiment of the present disclosure.

FIG. 11 illustrates a sectional configuration of a display unit (a display unit 4) according to the third embodiment of the present disclosure. The display unit 4 differs from the above-described embodiments and the like in that the hydrogen absorption layer H is additionally formed, in addition to existing layers, in a position of any of the layers configuring the display units 1 to 3 in the above-described first embodiment and the like. The hydrogen absorption layer H may be provided in a position between the oxide semiconductor layer 23 and a layer capable of releasing hydrogen (for example, the protective film 35). In this embodiment, the hydrogen absorption layer H is formed in a same layer as the source electrode 24A and the drain electrode 24B on the interlayer insulating film 25A.

The hydrogen absorption layer H is made of the hydrogen storage alloy, the mixture of the oxidizer and the organic matter having a double bond in a molecule, the adsorbent, or the mixture of the particles of the hydrogen absorbent and the resin. The material of the hydrogen absorption layer H may be selected from the above-described materials as appropriate depending on the position where the hydrogen absorption layer H is provided in the display unit 4. In this embodiment, since the hydrogen absorption layer H is disposed in the same layer as the source electrode 24A and the drain electrode 24B, in a case where a conductive hydrogen absorbent is used, as illustrated in FIG. 11, the hydrogen absorption layer H is formed at a certain distance to the source electrode 24A and the drain electrode 24B. In a case where an insulating material such as the mixture of the oxidizer and the organic matter having a double bond in a molecule, the adsorbent, or the mixture of the hydrogen absorbent and the resin is used, the insulating material may be provided in a film form between the interlayer insulating film 24B and the planarization film 27, between the planarization film 27 and the pixel electrode 31, or the like.

6. FOURTH EMBODIMENT

Figure 12:
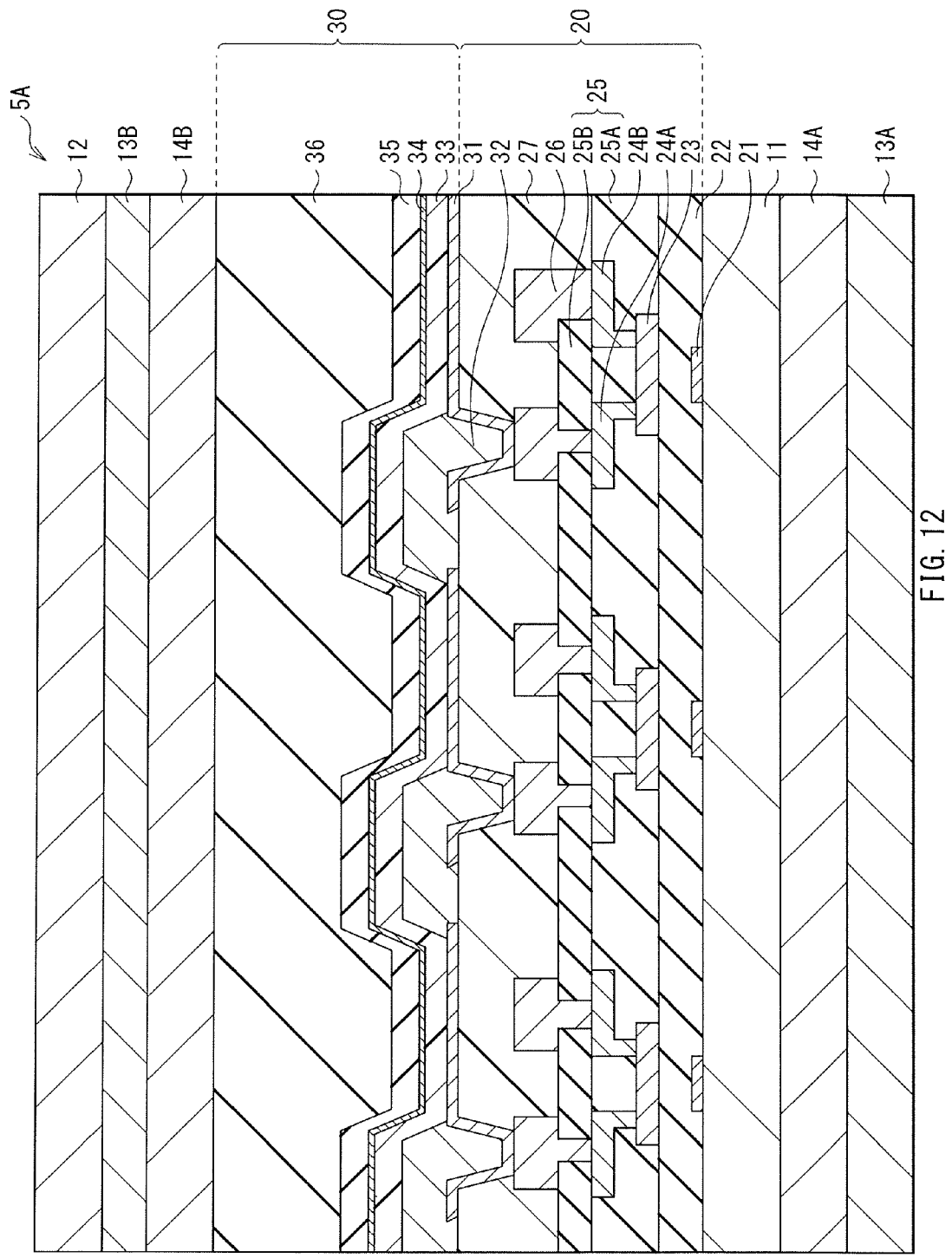
FIG. 12 is a sectional view illustrating an example of a configuration of a display unit according to a fourth embodiment of the present disclosure.

FIG. 12 illustrates a sectional configuration of a display unit (a display unit 5) according to the fourth embodiment of the present disclosure. The display unit 5 uses substrates with flexibility as the substrate 11 and the counter substrate 12.

The substrate 11 and the counter substrate 12 are made of a material with flexibility, and examples of the material may include organic polymers (having a form of a polymer such as a plastic film, a plastic sheet, or a plastic substrate having flexibility made of a polymer) such as poly(methyl methacrylate) (PMMA), polyvinyl alcohol (PVA), polyvinyl phenol (PVP), polyether sulfone (PES), polyimide, polycarbonate, and polyethylene terephthalate (PET).

Moreover, the substrate 11 and the counter substrate 12 made of the material with flexibility as with this embodiment have higher gas permeability, compared to a case where the substrate 11 and the counter substrate 12 are formed of glass or the like. Accordingly, water, oxygen, hydrogen, and the like that cause deterioration in properties of the oxide semiconductor are apt to enter the display unit 5. Therefore, protective films 13A and 13B may be preferably formed inside (a side where the light-emitting device 30W and the like are formed) or outside (outside of the display unit 5) the substrate 11 and the counter substrate 12. It is to be noted that, in FIG. 12, the protective films 13A and 13B are formed outside the substrate 11 and inside the counter substrate 12, respectively.

The protective films 13A and 13B are made of a material similar to that of the above-described protective film 35, and the protective films 13A and 13B are capable of releasing hydrogen. Therefore, for example, as illustrated in FIG. 12, hydrogen absorption layers 14A and 14B may be preferably provided between the protective films 13A and 13B, and the oxide semiconductor layer 23 so as to come into contact with the protective films 13A and 13B. The protective film 13A (13B) and the hydrogen absorption layer 14A (14B) with respect to the substrate 11 (and the counter substrate 12) may be disposed either in the inside where the light-emitting device 30W and the like are provided of the display unit 5 or outside the display unit 5.

Figure 13:
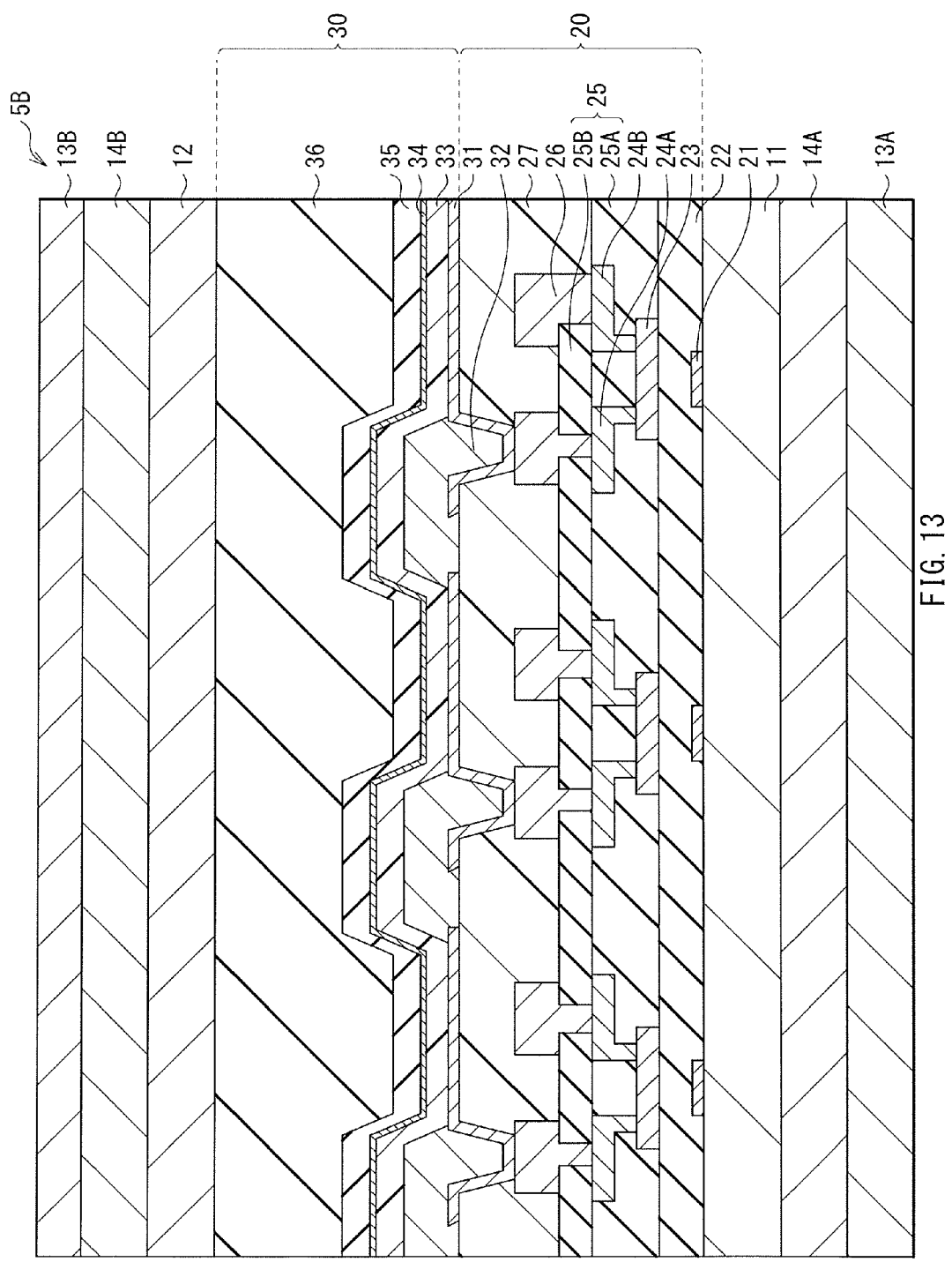
FIG. 13 is a sectional view illustrating another example of the configuration of the display unit according to the fourth embodiment of the present disclosure.

It is to be noted that, as illustrated in FIG. 13, the protective film 13A (or the protective film 13B) and the hydrogen absorption layer 14A (or the hydrogen absorption layer 14B) may be disposed outside the display unit 5, and even in this case, as the laminating order, the hydrogen absorption layers 14A and 14B are disposed on a side closer to the oxide semiconductor layer 23 as with a case where the hydrogen absorption layers 14A and 14B are disposed inside the display unit 5.

As described above, in this embodiment, even in the display unit 5 having flexibility, effects similar to those in the above-described first embodiment are allowed to be obtained by disposing a laminate film of the protective film 13A and the hydrogen absorption layer 14A and a laminate film of the protective film 13B and the hydrogen absorption layer 14B in positions in contact with the substrate 11 and the counter substrate 12.

7. MODIFICATION EXAMPLE 2

Figure 14:
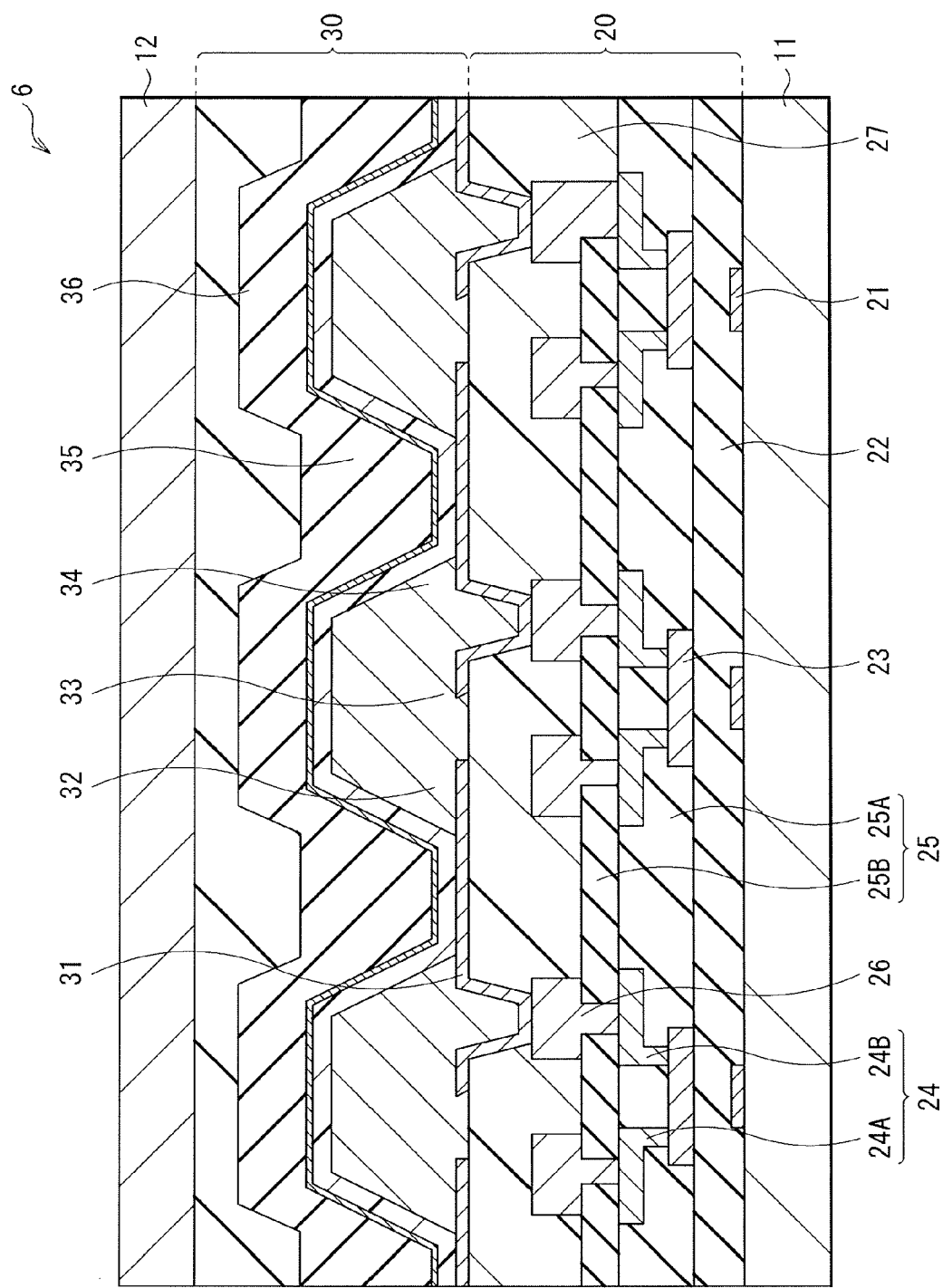
FIG. 14 is a sectional view illustrating a configuration of a display unit according to Modification Example 2 of the present disclosure.

FIG. 14 illustrates a sectional configuration of a display unit (a display unit 6) according to a modification example of the above-described first to fourth embodiments and the above-described Modification Example 1. The display unit 6 differs from the above-described embodiments and the like in that the display unit 6 is a so-called bottom emission display unit in which light generated in the light-emitting layer is emitted from a bottom surface (the substrate 11) thereof.

It is to be noted that, as with the above-described embodiments and the like, the hydrogen absorption layer H may be provided between the insulating film (for example, the protective film 35) capable of releasing hydrogen or the metal layer (for example, the counter electrode 34) and the oxide semiconductor layer 23, and the position of the hydrogen absorption layer H is not specifically limited.

8. MODIFICATION EXAMPLE 3

Figure 15:
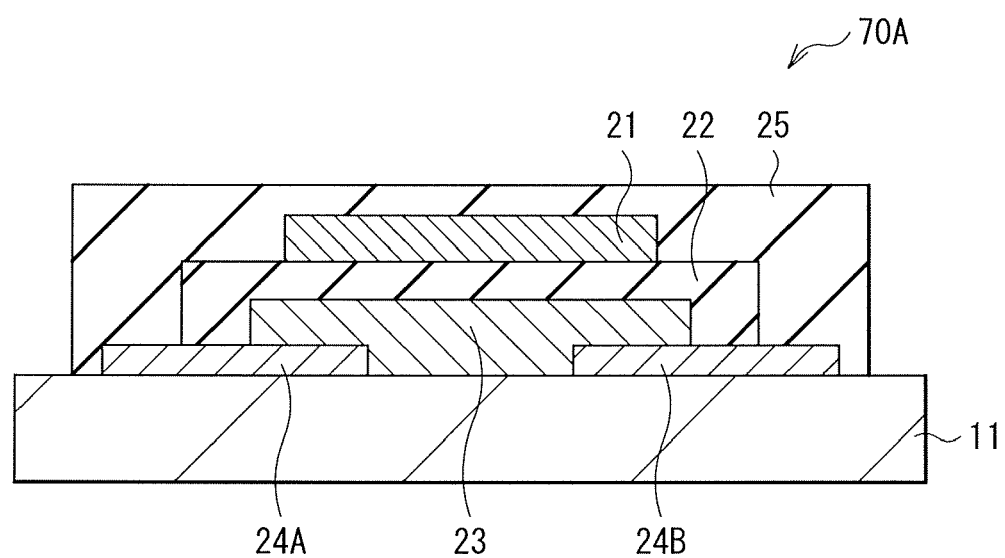
FIG. 15 is a sectional view illustrating a configuration of a TFT of a display unit according to Modification Example 3 of the present disclosure.

FIG. 15 illustrates a sectional configuration of a TFT 70A applicable to the display units according to the above-described first to fourth embodiments and the above-described Modification Examples 1 and 2. The TFT 70A has a stagger (so-called top gate type) configuration, and a channel is made of the oxide semiconductor as with the above-described embodiments and the like.

It is to be noted that, as with the above-described Modification Example 2, the hydrogen absorption layer H may be provided between the insulating film (for example, the protective film 35) capable of releasing hydrogen or the metal layer (for example, the counter electrode 34) and the oxide semiconductor layer 23, and the position of the hydrogen absorption layer H is not specifically limited.

9. APPLICATION EXAMPLES

The display units 1 to 6 described in the above-described embodiments and the above-described modification examples may be suitably used in the following electronic apparatuses.

Application Example 1

Figure 16A:
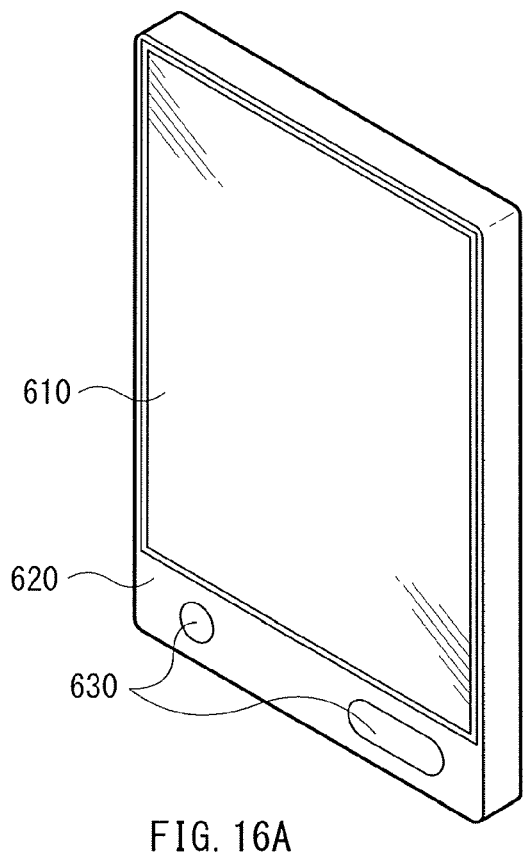
Figure 16B:
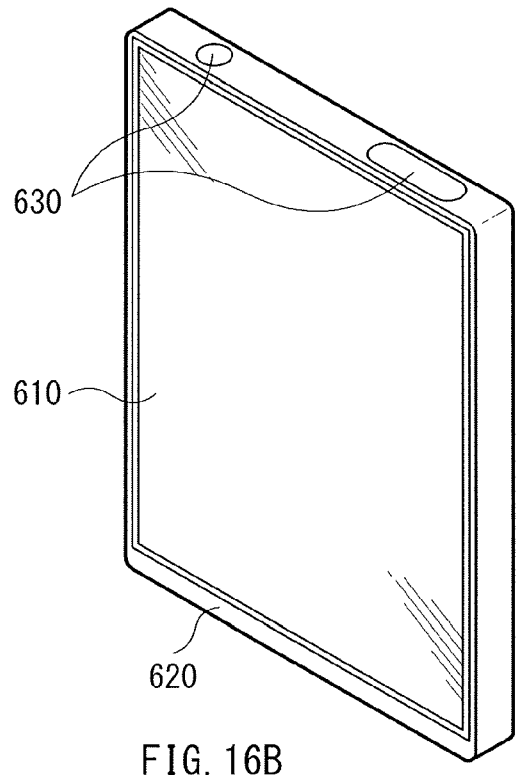

FIG. 16A illustrates an appearance viewed from a front side of a smartphone, and FIG. 16B illustrates an appearance viewed from a back side of the smartphone. The smartphone may include, for example, a display section 610 (any one of the display units 1 to 6), a non-display section (an enclosure) 620, and an operation section 630. The operation section 630 may be disposed on a front surface of the non-display section 120 as illustrated in FIG. 16A, or may be disposed on a top surface of the non-display section 120 as illustrated in FIG. 16B.

Application Example 2

Figure 17:
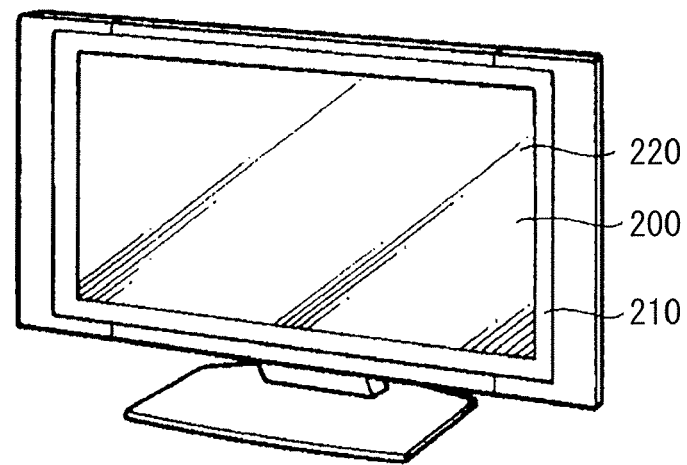
FIG. 17 is a perspective view illustrating an appearance of Application Example 2.

FIG. 17 illustrates an appearance of a television according to Application Example 2. The television may include, for example, an image display screen section 200 including a front panel 210 and a filter glass 220, and the image display screen section 200 corresponds to any of the above-described display units.

Application Example 3

Figure 18A:
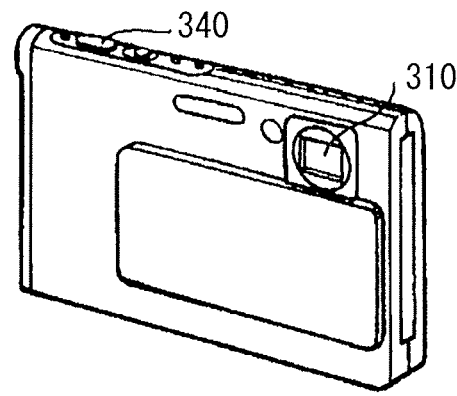
FIG. 18A is a perspective view illustrating an appearance viewed from a front side of Application Example 3.
Figure 18B:
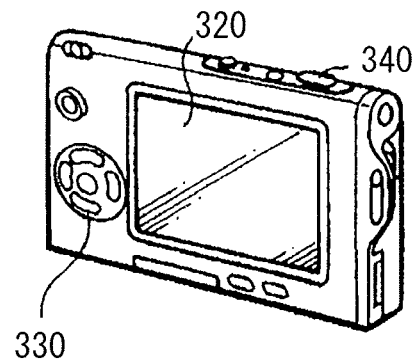
FIG. 18B is a perspective view illustrating an appearance viewed from a back side of Application Example 3.

FIG. 18A illustrates an appearance viewed from a front side of a digital camera according to Application Example 3, and FIG. 18B illustrates an appearance viewed from a back side of the digital camera. The digital camera may include, for example, a light-emitting section 310 for a flash, a display section 320 as any of the above-described display units, a menu switch 330, and a shutter button 340.

Application Example 4

Figure 19:
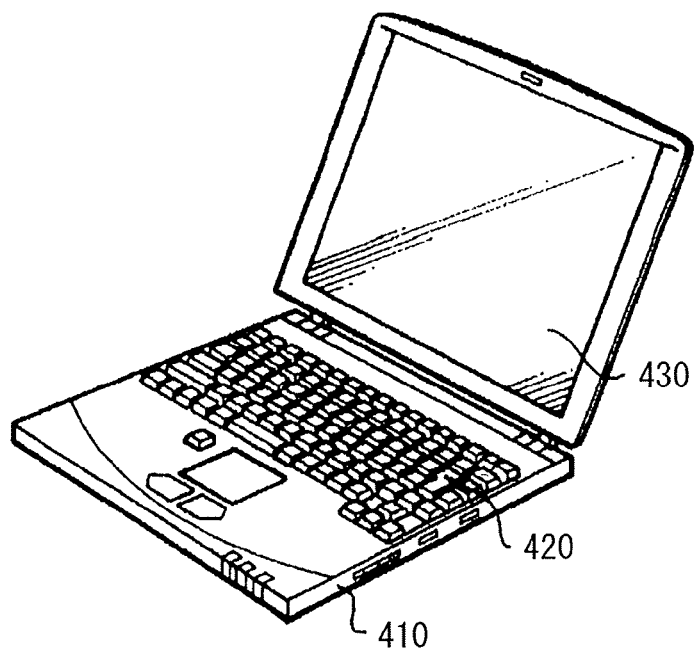
FIG. 19 is a perspective view illustrating an appearance of Application Example 4.

FIG. 19 illustrates an appearance of a notebook personal computer according to Application Example 4. The notebook personal computer may include, for example, a main body 410, a keyboard 420 for operation of inputting characters and the like, and a display section 430 as any of the above-described display units.

Application Example 5

Figure 20:
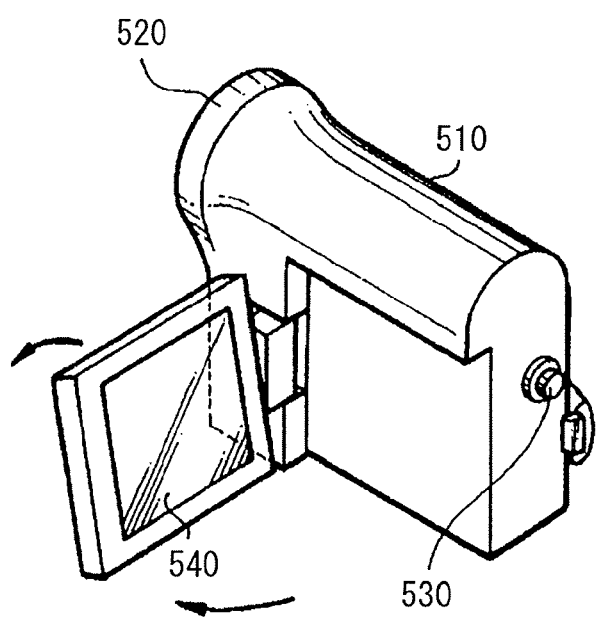
FIG. 20 is a perspective view illustrating an appearance of Application Example 5.

FIG. 20 illustrates an appearance of a video camera according to Application Example 5. The video camera may include, for example, a main body 510, a lens 520 provided on a front surface of the main body 510 and for shooting an image of a subject, a shooting start and stop switch 530, and a display section 540 as any of the above-described display units.

Application Examples 6

Figure 21A:
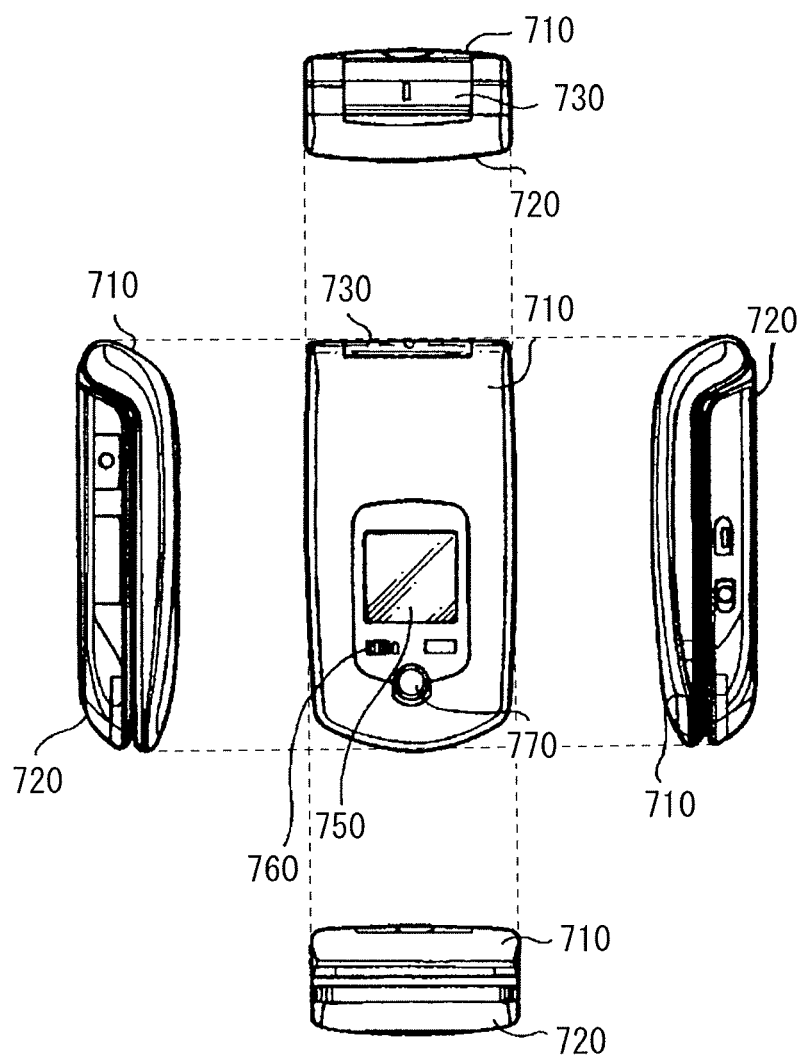
FIG. 21A is a front view, a left side view, a right side view, a top view, and a bottom view in a state in which Application Example 6 is closed.
Figure 21B:
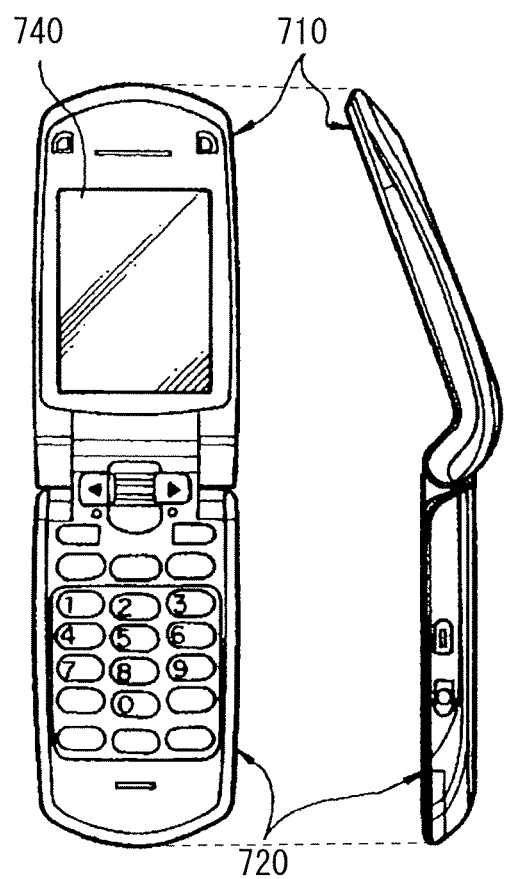
FIG. 21B is a front view and a side view in a state in which Application Example 6 is opened.

FIG. 21A illustrates a front view, a left side view, a right side view, a top view, and a bottom view in a state in which a cellular phone according to Application Example 6 is closed. FIG. 21B illustrates a front view and a side view in a state in which the cellular phone is opened. The cellular phone may have a configuration in which, for example, a top-side enclosure 710 and a bottom-side enclosure 720 are connected together through a connection section (hinge section) 730, and the cellular phone may include a display 740, a sub-display 750, a picture light 760, and a camera 770. The display 740 or the sub-display 750 corresponds to any of the above-described display units.

Although the present technology is described referring to the first to fourth embodiments and Modification Examples 1 to 3, the present technology is not limited thereto, and may be variously modified. For example, in the above-described embodiments and the like, the organic EL (Electro-Luminescence) device is described as the display layer 30; however, the display layer 30 may be configured of a liquid crystal layer, an electrophoretic device including electrophoretic particles between a pixel electrode and a counter electrode, an inorganic EL device, or the like.

Moreover, the material and thickness of each layer, the method and conditions of forming each layer are not limited to those described in the above-described embodiments and the like, and each layer may be made of any other material with any other thickness by any other method under any other conditions. Further, in the above-described embodiments and the like, the white light-emitting device 30W is formed as the light-emitting device of each of the pixels 10R, 10G, and 10B in the above-described embodiments and the like; however, the present technology is not limited thereto, and a red light-emitting device 30R emitting single-color light of red, a green light-emitting device 30G emitting single-color light of green, and a blue light-emitting device 30B emitting single-color light of blue may be provided corresponding to the pixels 10R, 10G, and 10B, respectively.

Moreover, in the above-described embodiments and the like, the configurations of the display units 1 to 6 are described in detail; however, it is not necessary to include all of the layers described in the above-described embodiments and the like, and a layer other than the layers described in the above-described embodiments and the like may be further included. For example, a high-resistive transparent layer with a high resistance value may be preferably inserted between the organic layer 33 and the counter electrode 34 of the light-emitting device 30W. When the high-resistive layer is provided, generation of a short circuit between electrodes caused by foreign matter or a projection during application of a voltage to the pixel electrode 31 and the counter electrode 34 is allowed to be prevented. Moreover, generation of a defective pixel or a missing line is allowed to be reduced. Resistivity of the high-resistive layer may be preferably, for example, within a range of about $1\times10^6$ Ω·m to about $1\times10^8$ Ω·m both inclusive. Further, the refractive index of the high-resistive layer may be preferably substantially equal to those of the organic layer 33 and the counter electrode 34, specifically, about 1.7 or more, and more preferably about 1.9 or more. Thus, external quantum efficiency of the light-emitting layer is allowed to be improved.

It is to be noted that the present disclosure may have the following configurations.

(1) A display unit including:
- an oxide semiconductor layer configured to form a channel;
- a first layer having electrical insulation or electrical conductivity; and
- a second layer including a hydrogen absorbent and disposed between the oxide semiconductor layer and the first layer.

(2) The display unit according to (1), in which the hydrogen absorbent includes one or more kinds selected from a group consisting of a hydrogen storage alloy, an oxidizer, organic matter having a double bond in a molecule, and an adsorbent.

(3) The display unit according to (2), in which the hydrogen storage alloy includes one kind or a combination of two or more kinds selected from a group consisting of titanium (Ti), manganese (Mn), zirconium (Zr), nickel (Ni), vanadium (V), palladium (Pd), aluminum (Al), magnesium (Mg), and calcium (Ca).

(4) The display unit according to (2) or (3), in which the oxidizer includes one kind or a combination of two or more kinds selected from a group consisting of potassium nitrate, hypochlorous acid, chlorous acid, chloric acid, perchloric acid, halogens, permanganic acid, ceric ammonium nitrate, chromic acid, dichromic acid, peroxide, and Tollens' reagent, and the organic matter having a double bond in a molecule includes one kind or a combination of two or more kinds selected from a group consisting of alkene and carbonyl compounds.

(5) The display unit according to any one of (2) to (4), in which the adsorbent includes one kind or a combination of two or more kinds selected from a group consisting of zeolite, mesoporous silica, layer silicate, activated carbon, carbon nanotube (CNT), graphite nanocarbon, and fullerene ($C_{60}$).

(6) The display unit according to any one of (1) to (5), in which the second layer is formed of a mixture of particles of the hydrogen absorbent and a resin material.

(7) The display unit according to (6), in which a particle diameter of the particles of the hydrogen absorbent is less than about 30 nm.

(8) The display unit according to (6) or (7), in which a concentration of the particles of the hydrogen absorbent included in the second layer is about 1% to about 50% both inclusive.

(9) The display unit according to any one of (6) to (8), in which the resin material includes one kind or two or more kinds selected from a group consisting of an acrylic resin, an epoxy resin, a polyimide resin, and a phenolic resin.

(10) The display unit according to any one of (1) to (9), in which the second layer includes a water absorbent.

(11) The display unit according to any one of (1) to (10), in which
a semiconductor layer including a wiring layer and a display layer disposed on the second layer are included on an substrate, the wiring layer including a gate electrode and a pair of source and drain electrodes provided with the oxide semiconductor layer in between, and a multilayer wiring line, and the display layer including a light-emitting layer between a first electrode and a second electrode facing each other, and
the first layer includes one or more of the wiring layer and an insulating layer that are provided in the semiconductor layer, the first electrode and the second electrode that are provided in the display layer, the organic layer, a barrier, and a sealing layer, the insulating layer configured to electrically insulate the wiring layer, the barrier configured to partition the organic layer for each pixel, and the sealing layer disposed on the second electrode.

(12) The display unit according to (11), in which the second layer is one or more of the wiring layer, the insulating layer, the first electrode and the second electrode, the organic layer, the barrier, and the sealing layer.

(13) The display unit according to (11) or (12), in which the second layer is disposed on a surface of the wiring layer.

(14) The display unit according to any one of (11) to (13), in which the insulating layer includes one or more kinds selected from a group consisting of a gate insulating film provided between the gate electrode and the semiconductor layer, an interlayer insulating film provided between layers of the multilayer wiring line, and a planarization film configured to planarize irregularities on the substrate.

(15) The display unit according to (14), in which the second layer is disposed between the gate insulating film and the interlayer insulating film, between the interlayer insulating film and the planarization film, or between the planarization film and the first electrode.

(16) The display unit according to any one of (2) to (15), in which
the organic layer includes a hole injection layer and an electron injection layer with the light-emitting layer in between, the hole injection layer having a hole injection property to the light-emitting layer, and the electron injection layer having an electron injection property to the light-emitting layer, and
the electron injection layer is made of a compound of alkali metal or alkali earth metal.

(17) The display unit according to any one of (2) to (16), in which the substrate has flexibility, and the first layer and the second layer are laminated in this order from the semiconductor layer side on one or more surfaces of the substrate.

(18) The display unit according to any one of (1) to (17), in which the first layer is made of silicon nitride.

(19) The display unit according to any one of (1) to (18), in which the second layer is made of one kind or two or more kinds selected from a group consisting of titanium oxide, zirconium oxide, nickel oxide, and indium oxide.

(20) An electronic apparatus provided with a display unit, the display unit including:
an oxide semiconductor layer configured to form a channel;
a first layer having electrical insulation or electrical conductivity; and
a second layer including a hydrogen absorbent and disposed between the oxide semiconductor layer and the first layer.

It should be understood by those skilled in the art that various modifications, combinations, sub-combinations, and alterations may occur depending on design requirements and other factors insofar as they are within the scope of the appended claims or the equivalents thereof.

What is claimed is:
1. A display unit comprising:
an oxide semiconductor layer configured to form a channel;
a first layer having electrical insulation or electrical conductivity; and
a second layer including a hydrogen absorbent and disposed between the oxide semiconductor layer and the first layer; wherein
a semiconductor layer including a wiring layer and a display layer disposed on the second layer are included on an substrate, the wiring layer including a gate electrode and a pair of source and drain electrodes provided with the oxide semiconductor layer in between, and a multilayer wiring line, and the display layer including a light-emitting layer between a first electrode and a second electrode facing each other, and
the first layer includes one or more of the wiring layer and an insulating layer that are provided in the semiconductor layer, the first electrode and the second electrode that are provided in the display layer, the organic layer, a barrier, and a sealing layer, the insulating layer configured to electrically insulate the wiring layer, the barrier configured to partition the organic layer for each pixel, and the sealing layer disposed on the second electrode.

2. The display unit according to claim 1, wherein the hydrogen absorbent includes one or more kinds selected from a group consisting of a hydrogen storage alloy, an oxidizer, organic matter having a double bond in a molecule, and an adsorbent.

3. The display unit according to claim 2, wherein the hydrogen storage alloy includes one kind or a combination of two or more kinds selected from a group consisting of titanium (Ti), manganese (Mn), zirconium (Zr), nickel (Ni), vanadium (V), palladium (Pd), aluminum (Al), magnesium (Mg), and calcium (Ca).

4. The display unit according to claim 2, wherein the oxidizer includes one kind or a combination of two or more kinds selected from a group consisting of potassium nitrate, hypochlorous acid, chlorous acid, chloric acid, perchloric acid, halogens, permanganic acid, ceric ammonium nitrate, chromic acid, dichromic acid, peroxide, and Tollens' reagent, and the organic matter having a double bond in a molecule includes one kind or a combination of two or more kinds selected from a group consisting of alkene and carbonyl compounds.

5. The display unit according to claim 2, wherein the absorbent includes one kind or a combination of two or more kinds selected from a group consisting of zeolite, mesoporous silica, layer silicate, activated carbon, carbon nanotube (CNT), graphite nanocarbon, and fullerene ($C_{60}$).

6. The display unit according to claim 2, wherein
the organic layer includes a hole injection layer and an electron injection layer with the light-emitting layer in between, the hole injection layer having a hole injection property to the light-emitting layer, and the electron injection layer having an electron injection property to the light-emitting layer, and
the electron injection layer is made of a compound of alkali metal or alkali earth metal.

7. The display unit according to claim 2, wherein the substrate has flexibility, and the first layer and the second layer are laminated in this order from the semiconductor layer side on one or more surfaces of the substrate.

8. The display unit according to claim 1, wherein the second layer is formed of a mixture of particles of the hydrogen absorbent and a resin material.

9. The display unit according to claim 8, wherein a particle diameter of the particles of the hydrogen absorbent is less than about 30 nm.

10. The display unit according to claim 8, wherein a concentration of the particles of the hydrogen absorbent included in the second layer is about 1% to about 50% both inclusive.

11. The display unit according to claim 8, wherein the resin material includes one kind or two or more kinds selected from a group consisting of an acrylic resin, an epoxy resin, a polyimide resin, and a phenolic resin.

12. The display unit according to claim 1, wherein the second layer includes a water absorbent.

13. The display unit according to claim 1, wherein the second layer is one or more of the wiring layer, the insulating layer, the first electrode and the second electrode, the organic layer, the barrier, and the sealing layer.

14. The display unit according to claim 1, wherein the second layer is disposed on a surface of the wiring layer.

15. The display unit according to claim 1, wherein the insulating layer includes one or more kinds selected from a group consisting of a gate insulating film provided between the gate electrode and the semiconductor layer, an interlayer insulating film provided between layers of the multilayer wiring line, and a planarization film configured to planarize irregularities on the substrate.

16. The display unit according to claim 15, wherein the second layer is disposed between the gate insulating film and the interlayer insulating film, between the interlayer insulating film and the planarization film, or between the planarization film and the first electrode.

17. The display unit according to claim 1, wherein the first layer is made of silicon nitride.

18. The display unit according to claim 1, wherein the second layer is made of one kind or two or more kinds selected from a group consisting of titanium oxide, zirconium oxide, nickel oxide, and indium oxide.

19. An electronic apparatus provided with a display unit, the display unit comprising:
an oxide semiconductor layer configured to form a channel;
a first layer having electrical insulation or electrical conductivity; and
a second layer including a hydrogen absorbent and disposed between the oxide semiconductor layer and the first layer; wherein
a semiconductor layer including a wiring layer and a display layer disposed on the second layer are included on an substrate, the wiring layer including a gate electrode and a pair of source and drain electrodes provided with the oxide semiconductor layer in between, and a multilayer wiring line, and the display layer including a light-emitting layer between a first electrode and a second electrode facing each other, and
the first layer includes one or more of the wiring layer and an insulating layer that are provided in the semiconductor layer, the first electrode and the second electrode that are provided in the display layer, the organic layer, a barrier, and a sealing layer, the insulating layer configured to electrically insulate the wiring layer, the barrier configured to partition the organic layer for each pixel, and the sealing layer disposed on the second electrode.

* * * * *